US012136646B2

(12) United States Patent
Yang et al.

(10) Patent No.: US 12,136,646 B2
(45) Date of Patent: Nov. 5, 2024

(54) COUPLED POLYSILICON GUARD RINGS FOR ENHANCING BREAKDOWN VOLTAGE IN A POWER SEMICONDUCTOR DEVICE

(71) Applicant: POWER INTEGRATIONS, INC., San Jose, CA (US)

(72) Inventors: Kuo-Chang Yang, Campbell, CA (US); Sorin Georgescu, Gilroy, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 298 days.

(21) Appl. No.: 17/615,553

(22) PCT Filed: Jun. 19, 2019

(86) PCT No.: PCT/US2019/037962
§ 371 (c)(1),
(2) Date: Nov. 30, 2021

(87) PCT Pub. No.: WO2020/256719
PCT Pub. Date: Dec. 24, 2020

(65) Prior Publication Data
US 2022/0238644 A1 Jul. 28, 2022

(51) Int. Cl.
*H01L 29/06* (2006.01)
*H01L 29/417* (2006.01)
(Continued)

(52) U.S. Cl.
CPC .... *H01L 29/0619* (2013.01); *H01L 29/41758* (2013.01); *H01L 29/7818* (2013.01); *H01L 29/808* (2013.01); *H01L 29/861* (2013.01)

(58) Field of Classification Search
CPC ........... H01L 29/41758; H01L 29/7818; H01L 29/808; H01L 29/861; H01L 29/16;
(Continued)

(56) References Cited

U.S. PATENT DOCUMENTS 6,693,308 B2   2/2004   Sankin et al.
6,815,304 B2   11/2004   Sankin et al.
(Continued)

FOREIGN PATENT DOCUMENTS

DE   10234677 A1 *   2/2004   ......... H01L 29/1083
JP   2001044431 A   2/2001
(Continued)

OTHER PUBLICATIONS

Japanese Notice of Reasons for Refusal; Application No. 2021-572927; Feb. 6, 2023; 3 pages.
(Continued)

*Primary Examiner* — Shahed Ahmed
(74) *Attorney, Agent, or Firm* — Brian H. Floyd

(57) ABSTRACT

Coupled polysilicon guard rings for enhancing breakdown voltage in a power semiconductor device are presented herein. Polysilicon guard rings are disposed above the power device drift region and electrically coupled to power device regions (e.g., device diffusions) so as to spread electric fields associated with an operating voltage. Additionally, PN junctions (i.e., p-type and n-type junctions) are formed within the polysilicon guard rings to operate in reverse bias with a low leakage current between the power device regions (e.g., device diffusions). Low leakage current may advantageously enhance the electric field spreading without deleteriously affecting existing (i.e., normal) power device performance; and enhanced electric field spreading may in turn reduce breakdown-voltage drift.

32 Claims, 26 Drawing Sheets

(51) Int. Cl.
*H01L 29/78* (2006.01)
*H01L 29/808* (2006.01)
*H01L 29/861* (2006.01)

(58) Field of Classification Search
CPC ............. H01L 29/0696; H01L 29/0653; H01L 29/405; H01L 29/66681–66704; H01L 29/7816–7826; H01L 29/66136; H01L 29/868; H01L 29/0619–0623
See application file for complete search history.

(56) References Cited

U.S. PATENT DOCUMENTS

| | | | |
|---|---|---|---|
| 6,900,506 | B1 | 5/2005 | Yu et al. |
| 7,009,228 | B1 | 3/2006 | Yu |
| 7,202,528 | B2 | 4/2007 | Sankin et al. |
| 7,229,866 | B2 | 6/2007 | Zhu et al. |
| 7,416,929 | B2 | 8/2008 | Mazzola et al. |
| 7,638,379 | B2 | 12/2009 | Cheng et al. |
| 7,863,172 | B2 | 1/2011 | Zhu et al. |
| 8,017,981 | B2 | 9/2011 | Sankin et al. |
| 8,384,182 | B2 | 2/2013 | Mazzola et al. |
| 8,592,826 | B2 | 11/2013 | Mazzola |
| 8,653,583 | B2 | 2/2014 | Parthasarathy et al. |
| 8,928,074 | B2 | 1/2015 | Cheng et al. |
| 2001/0048122 | A1* | 12/2001 | Tada ............... H01L 29/7818 257/E29.256 |
| 2003/0107102 | A1 | 6/2003 | Ozeki et al. |
| 2008/0197408 | A1* | 8/2008 | Disney ............. H01L 29/41766 257/E29.027 |
| 2015/0357404 | A1 | 12/2015 | Sato et al. |
| 2016/0005858 | A1* | 1/2016 | Ma ................. H01L 29/7818 257/493 |
| 2016/0056248 | A1* | 2/2016 | Tanaka ............. H01L 29/861 257/329 |
| 2018/0308962 | A1* | 10/2018 | Li ................. H01L 29/7393 |

FOREIGN PATENT DOCUMENTS

| | | |
|---|---|---|
| JP | 2015230965 A | 12/2015 |
| KR | 20140121415 A | 10/2014 |
| KR | 20190038717 A | 4/2019 |
| TW | 201714224 A | 4/2017 |

OTHER PUBLICATIONS

Machine Translation of Japanese Notice of Reasons for Refusal; Application No. 2021-572927; Feb. 6, 2023; 3 pages.
International Application No. PCT/US2019/037962, International Search Report and Written Opinion, Mar. 5, 2020, 9 Pages.
Korean Patent Application No. 1020217041476; "Reasons for Refusal" with Machine Translation dated Oct. 24, 2023, 15 pages.
Korean Application Serial No. 10-2021-7041476; "Notice of Allowance of Patent with Machine Translation"; mailed May 7, 2024; 9 pages.
Taiwan Application Serial No. 109120376; "Review Opinion and Search Report with Machine Translation"; mailed Feb. 15, 2024; 16 pages.
TW Application No. 1091120376, "Office Action (Rejection Decision)". Mailed Aug. 7, 2024; 8 pages.
TW Application No. 1091120376, Machine Translation of "Office Action (Rejection Decision)". Mailed Aug. 7, 2024; 8 pages.

* cited by examiner

COUPLED POLYSILICON GUARD RINGS FOR ENHANCING BREAKDOWN VOLTAGE IN A POWER SEMICONDUCTOR DEVICE

CROSS-REFERENCE TO RELATED APPLICATIONS

This application is a National Stage Entry of International Patent Application No. PCT/US2019/037962, filed on Jun. 19, 2019, hereby incorporated by reference in its entirety.

FIELD OF THE DISCLOSURE

The present invention relates to guard rings for improving breakdown voltage in a power field effect transistor and more particularly to polysilicon guard rings.

BACKGROUND INFORMATION

Power field effect transistors (FETs) may be gated to block high voltages in an off-state and to provide high currents in an on-state. A power FET may be characterized by its breakdown (i.e., blocking) voltage and by its on-resistance; and a figure of merit commonly used to characterize the power FET is specific on-resistance. Specific on-resistance refers to on-resistance multiplied by device area and provides a measure of how much semiconductor area may be required to realize a desired value of on resistance. Ideally, a power device is designed to have low specific on-resistance and high breakdown voltage.

One type of power FET is the lateral diffused metal oxide field effect transistor (LDMOS), designed for lateral current flow from drain to source. The lateral current flow may be gated via control of a channel region at or near a surface interface between the oxide and semiconductor; and a drift region may be used for supporting (i.e., blocking) a high voltage in the off-state. Blocking voltage (i.e., breakdown voltage) can often be improved by increasing drift region length and by tailoring doping concentration profiles. For instance, doping concentrations may be adjusted according to reduced surface field (RESURF) techniques.

Another type of power FET is the junction field effect transistor (JFET). Current flow may also flow laterally from a drain to a source; however, unlike in the LDMOS, current may be gated by a reverse biased diffused junction of opposite material types (e.g., p-type and n-type).

BRIEF DESCRIPTION OF THE DRAWINGS

Non-limiting and non-exhaustive embodiments of coupled polysilicon guard rings for enhancing breakdown voltage in a power semiconductor device are described with reference to the following figures, wherein like reference numerals refer to like parts throughout the various views unless otherwise specified.

Figure 1A:
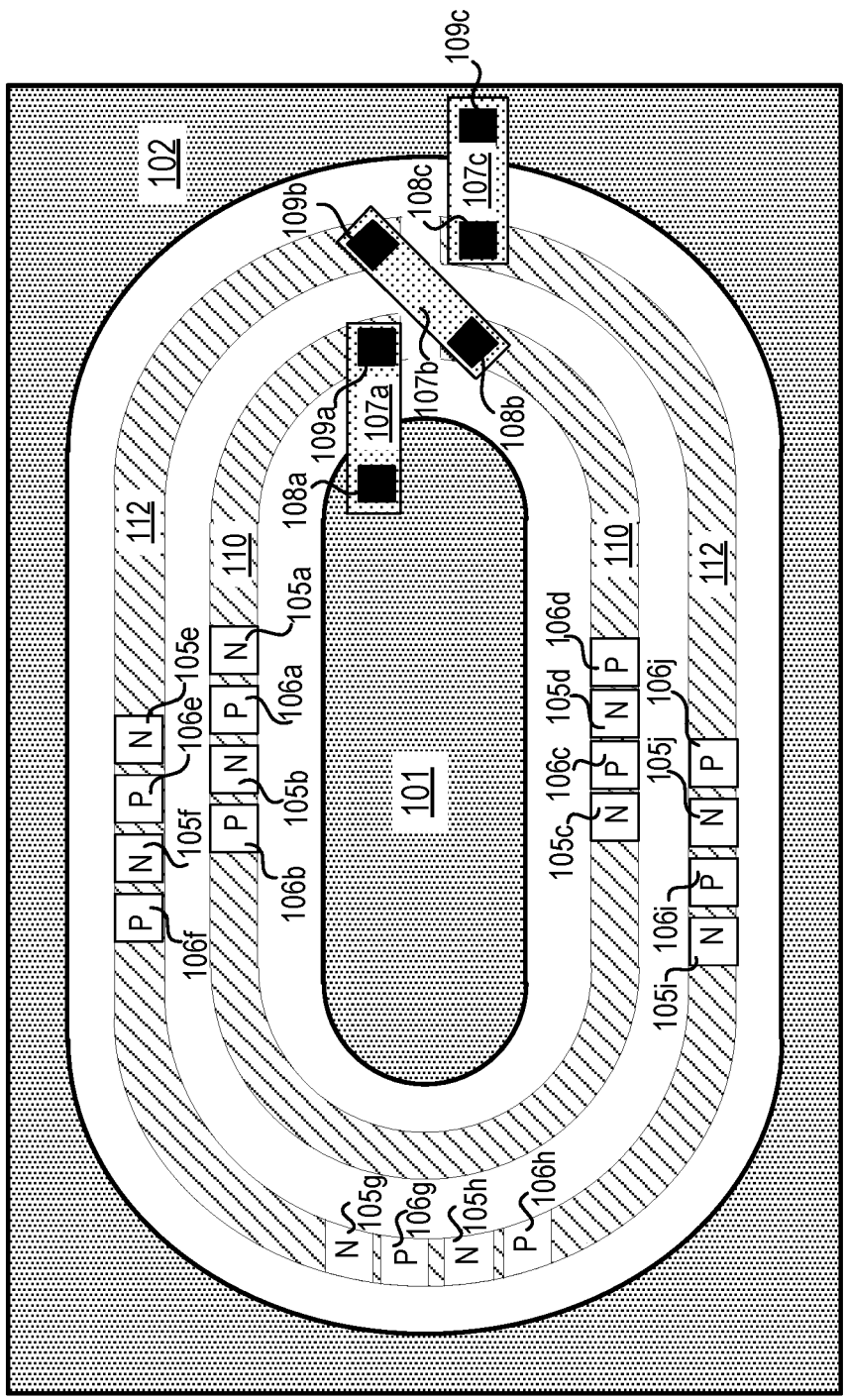
FIG. 1A illustrates a top view of a simple device structure including guard rings according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements and layers in the figures may be exaggerated relative to other elements to help to improve understanding of various embodiments of the teachings herein. Also, common but well-understood elements, layers, and/or process steps that are useful or necessary in a commercially feasible embodiment are often not depicted in order to facilitate a less obstructed view of these various embodiments coupled polysilicon guard rings for enhancing breakdown voltage in a power semiconductor device.

DETAILED DESCRIPTION

In the following description, numerous specific details are set forth in order to provide a thorough understanding of coupled polysilicon guard rings for enhancing breakdown voltage in a power semiconductor device. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure, method, process, and/or characteristic described in connection with the embodiment or example is included in at least one embodiment of coupled polysilicon guard rings for enhancing breakdown voltage in a power semiconductor device. Thus, appearances of the phrases "in one embodiment", "in an embodiment", "one example" or "an example" in various places throughout this specification are not necessarily all referring to the same embodiment or example. Furthermore, the particular features, structures, methods, processes and/or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, a transistor may comprise an N-channel metal-oxide-semiconductor (NMOS) field-effect transistor (FET) with the high-voltage being supported between the first terminal, a drain, and the second terminal, a source.

Also, throughout this specification, several terms of art are used. These terms are to take on their ordinary meaning in the art from which they come, unless specifically defined herein or the context of their use would clearly suggest otherwise. For instance, one of ordinary skill in the art may recognize and distinguish sheet resistance (i.e., sheet rho) from resistivity. Additionally, it should be noted that element names and symbols may be used interchangeably throughout this document (e.g., Si vs. silicon); however, both have identical meanings.

Research in the area of modern power devices is devoted towards improving breakdown voltage, reducing specific on resistance, and reducing the cost of manufacturing. In this endeavor, device researchers seek ways to fabricate and to improve characteristics of power FETs formed in a standard (i.e., low cost) complementary metal oxide semiconductor (CMOS) processes.

As discussed above current may flow laterally in power FETs, including LDMOS and/or JFETs, through a drift region. Both the specific on-resistance and breakdown voltage may depend, at least in part, on properties of the drift region; for instance, both breakdown voltage and specific on-resistance may increase as a function of drift region length.

Also as discussed above, ideally a power device is designed to have low specific on-resistance and high breakdown voltage. Thus, simply increasing drift region length may not achieve the ideal; and charge sharing techniques, such as RESURF, may be used to further reduce peak electric fields.

However, the design of a high voltage JFET and/or a high voltage LDMOS, even with the use of RESURF techniques, is met with challenges. For instance, in a standard CMOS process using RESURF techniques, a breakdown voltage of seven hundred volts or higher may necessitate a minimum drift-region length of at least sixty microns.

Unfortunately, the surface above the drift region may be exposed to mobile and/or fixed charges; and a device having a long drift-region length (e.g., greater than sixty microns) may be susceptible to reliability problems. For instance, in some applications, mold compound, used during the packaging process, may introduce mobile and/or fixed surface charge. Alternatively, and additionally, in a shallow trench isolation (STI) CMOS process, an inter-layer dielectric (ILD) layer may also introduce mobile and/or fixed surface charge.

The mobile and/or fixed charge may cause breakdown voltage to drift (i.e., to vary) below the desired rating after long term high temperature reverse bias (HTRB) reliability testing or after temperature humidity bias testing (THBT). Such variation in the breakdown voltage is undesirable. Accordingly, there is a need for a power device structure which mitigates the deleterious effects of mobile and/or fixed charges at the surface of the drift region. Moreover, there is a need for a power device structure which mitigates breakdown voltage drift in existing power device structures without introducing additional process complexity and without affecting existing power device performance.

Coupled polysilicon guard rings for enhancing breakdown voltage in a power semiconductor device are presented herein. Polysilicon guard rings are disposed above the power device drift region and electrically coupled to power device regions (e.g., diffusions) so as to spread electric fields associated with an operating voltage. Additionally, PN junctions (i.e., p-type and n-type junctions) are formed within the polysilicon guard rings to operate in reverse bias with a low leakage current between the power device regions (e.g., diffusions). Low leakage current may advantageously enhance the electric field spreading without deleteriously affecting existing (i.e., normal) power device performance; and enhanced electric field spreading may in turn reduce breakdown-voltage drift.

FIG. 1A illustrates a top view of a simple device structure 100 including guard rings 110, 112 according to an embodiment. The simple device structure 100 includes a device region 101, a device region 102, and interconnect segments 107a-c. As will be illustrated further below with regards to FIG. 1D and FIG. 1E, device regions 101, 102 may be diffused and/or implanted regions. Also, the guard rings 110, 112 can be thin film guard rings. For instance, the guard rings 110, 112 may be polysilicon guard rings.

As illustrated, interconnect segment 107a may electrically connect to device region 101 with an ohmic contact 108a and to guard ring 110 with an ohmic contact 109a. In this way the device region 101 may be electrically coupled to the guard ring 110 by interconnect segment 107a. Similarly, interconnect segment 107b may electrically connect to guard ring 110 with an ohmic contact 108b and to guard ring 112 with an ohmic contact 109b, so that guard rings 110 and 112 become electrically coupled by interconnect segment 107b. Also, interconnect segment 107c may electrically connect to guard ring 112 with an ohmic contact 108c and to device region 102 with an ohmic contact 109c; and in this way device region 102 may be electrically coupled to guard ring 112 with interconnect segment 107c.

Also as illustrated, guard ring 110 includes N-regions 105a-d and P-regions 106a-d; and guard ring 112 includes N-regions 105e-j and P-regions 106e-j. In some embodiments N-regions 105a-j and P-regions 106a-j may be implanted. For instance, during CMOS processing, N-regions 105a-j and P-regions 106a-j may be formed concurrent with the masking and implant steps relating to the formation of CMOS transistors.

Additionally, the N-regions 105a-j and P-regions 106a-j may be placed to form potential barriers (e.g., PN junctions) within the guard rings 110, 112. For instance, as will be further illustrated below with respect to FIG. 1F, the N-regions 105a-j may be arranged to electrically function as cathodes while the P-regions 106a-j may be placed to electrically function as anodes. In this manner the N-regions 105a-j and P-regions 106a-j may advantageously block (i.e., limit) current flow within the guard rings 110, 112 while improving a field spreading profile of the guard rings 110, 112.

Although the simple device structure 100 shows two guard rings 110, 112, ten N-regions 105a-j, and ten P-regions 106a-j, device structures having greater or fewer guard rings and greater or fewer N-regions and/or P-regions are possible. Additionally, although the simple device structure 100 shows the device regions 101, 102 and guard rings 110, 112 as being electrically coupled using three interconnect segments 107a-c, each having ohmic contacts 108a-c, 109a-c, other interconnect layers and/or coupling approaches are possible. For instance, interconnect segments 107a. 107c could be formed on a first layer of metal; while interconnect segment could be formed using the same material as guard rings 110, 112 (e.g., polysilicon) to obviate the need for ohmic contacts 108b, 109b.

Figure 1B:
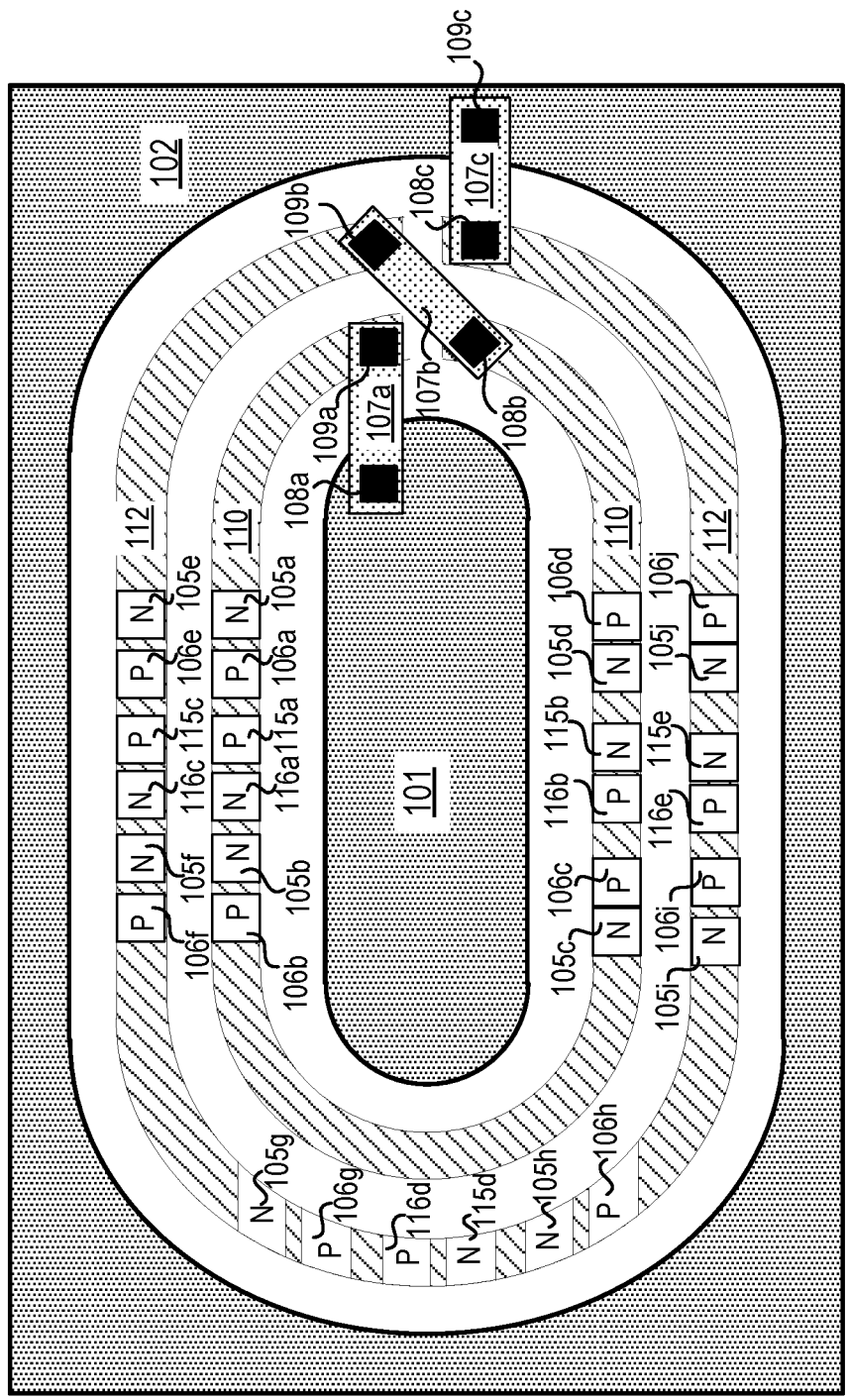
FIG. 1B illustrates a top view of a simple device structure including guard rings according to another embodiment.

FIG. 1B illustrates a top view of a simple device structure 113 including guard rings 110, 112 according to another embodiment. The simple device structure 113 is similar to device structure 100 except the guard rings 110, 112 include additional N-regions 115a-e and P-regions 116a-e. Additionally, as will be shown with regards to FIG. 1G, the N-regions 115a-e may electrically function as cathodes and the P-regions 116a-e may electrically function as anodes to form PN-junctions (e.g., diodes), directed opposite to the PN-junctions formed by P-regions 106a-j and N-regions 105a-j.

Figure 1C:
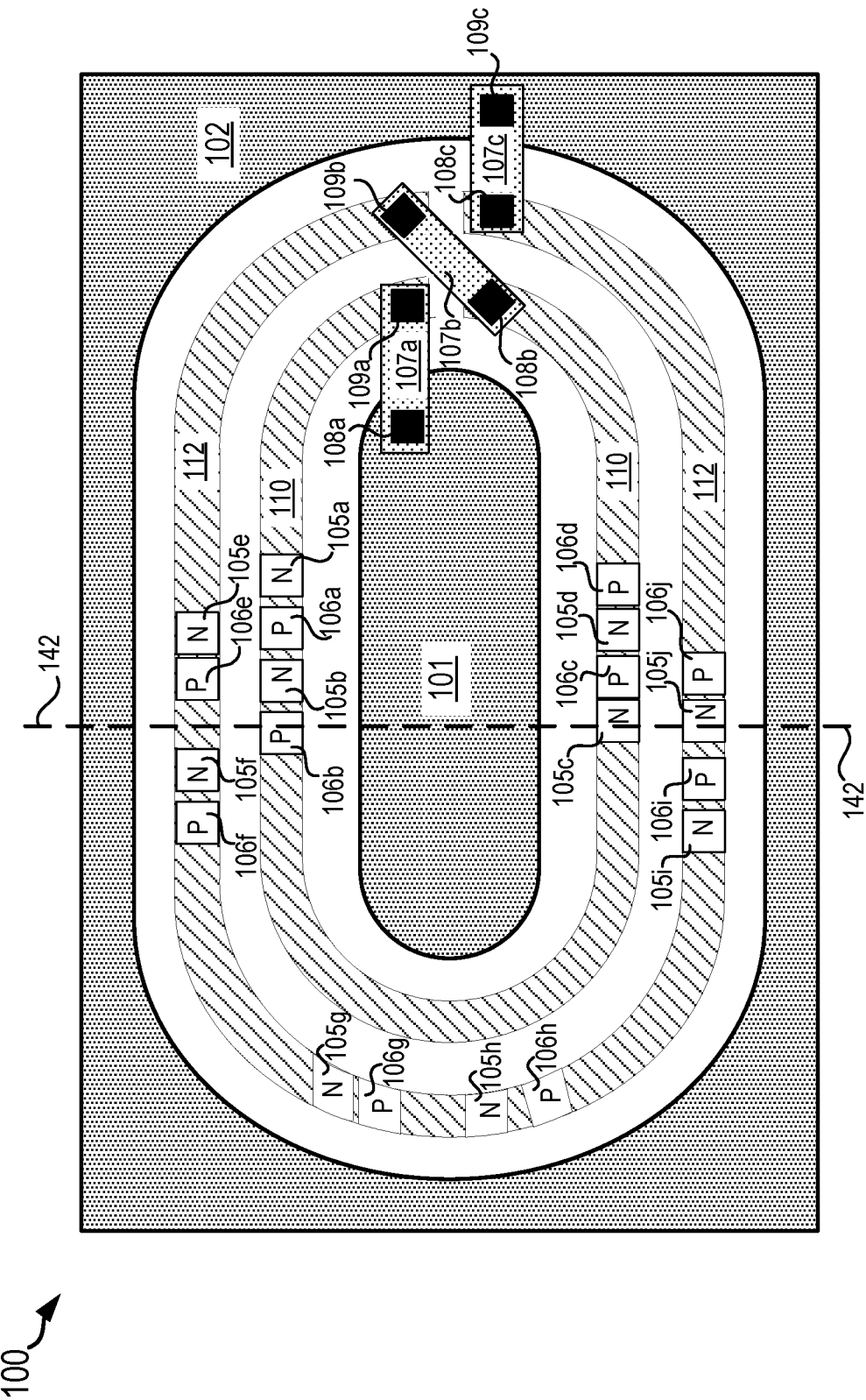
FIG. 1C illustrates the top view delineating a cross-section slice line in a simple device structure according to an embodiment.
Figure 1D:
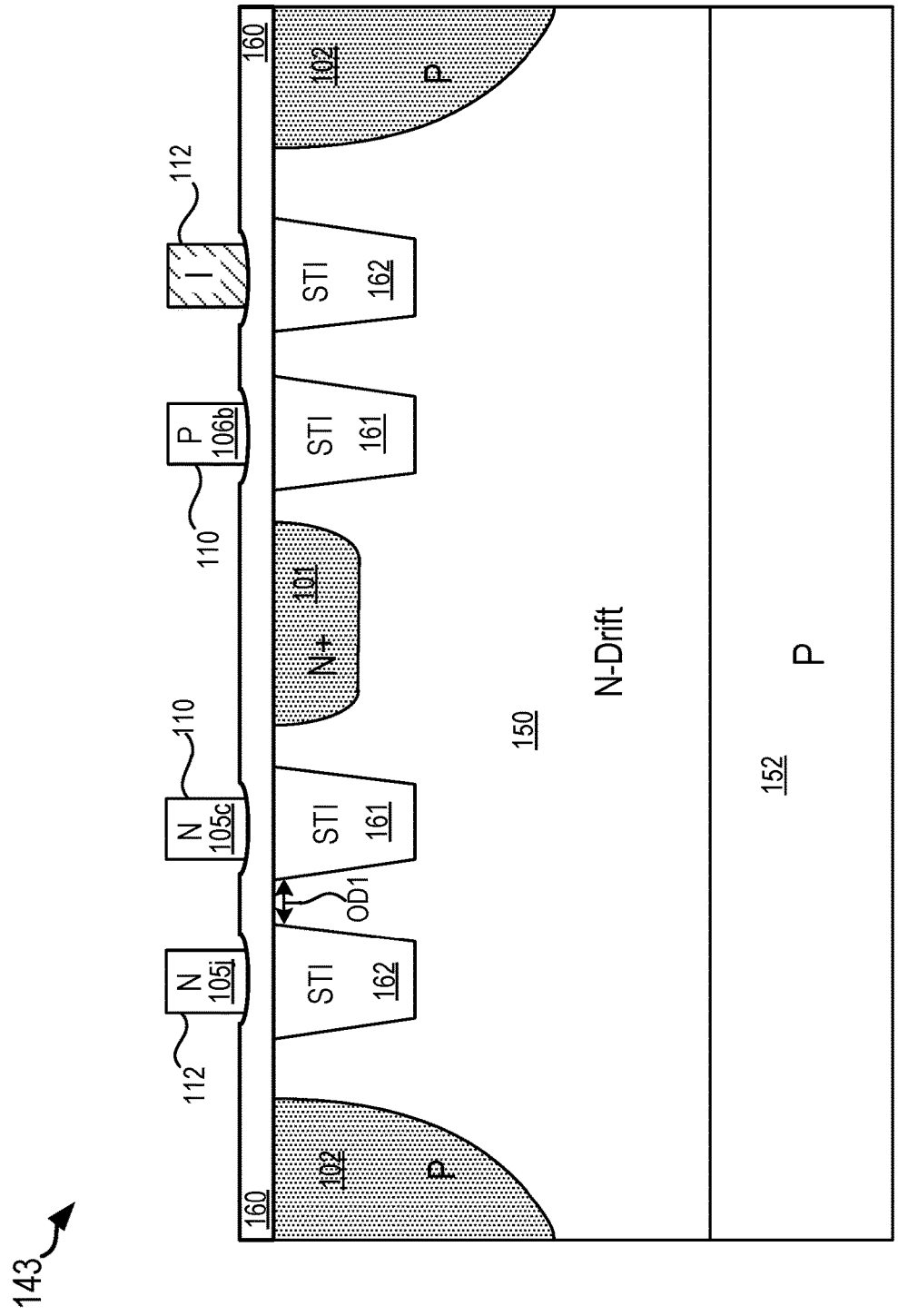
FIG. 1D illustrates a cross section along the slice line of FIG. 1C according to a first embodiment.

FIG. 1C illustrates the top view delineating a cross-section slice line 142 in the simple device structure 100 according to an embodiment; and FIG. 1D illustrates a cross section 143 along the slice line 142 of FIG. 1C according to a first embodiment. As shown in FIG. 1C, the slice line 142 slices across the simple device structure 100 through the N-region 105j, the N-region 105c, the P-region 106b, and through an intrinsic portion of guard ring 112. Accordingly, the cross section 143 respectively shows the cross sectional slices of the N-region 105j, the N-region 105c, the P-region 106b, and the intrinsic (I) portion of guard ring 112.

Also, with reference to both FIG. 1C and FIG. 1D, the cross section 143 shows a P-layer 152, an N-drift region 150, and an oxide layer 160 which may be formed during fabrication steps in a CMOS process (e.g., a Silicon CMOS process). For instance, P-layer 152 can be formed as a buried layer, and the N-drift region 150 can be formed as an epitaxial layer. The cross section 143 also shows the device-region 101 as having an n-type (N+) diffusion profile and the device-region 102 as having a p-type (P) diffusion profile.

According to the first embodiment, the CMOS process may use shallow trench isolated (STI) trenches 161, 162 formed beneath the guard rings 110, 112. Both STI trenches 161, 162 may have a similar pattern (e.g., a ring shape pattern) coinciding with that of the guard rings 110, 112 and may include (i.e., be filed with) an oxide and/or insulating material (e.g., Silicon dioxide $SiO_2$). The STI trenches may be positioned within the N-drift region 150 according to process defined critical dimensions (CDs). Additionally, the spacing between guard ring 110 and guard ring 112 may be determined, at least in part, by an active layer oxide density (OD) (e.g., OD layer) requirement allowing subsequent ILD and metallization layers to be formed properly with chemical mechanical polishing (CMP). For instance, as illustrated in FIG. 1D, the STI trench 161 and STI trench 162 may be separated by a dimension OD1 (e.g., an OD layer dimension). In this way the STI trench 161 and STI trench 162 may be positioned within the N-drift region 150 according to an OD layer critical dimension and/or to an OD layer density requirement; this, in turn, may advantageously mitigate "dishing" and/or erosion during a subsequent CMP process step.

Cross section 143 may correspond with that of a simplified power device structure. For instance, the N-drift region 150 can be a high-voltage drift region for supporting an applied voltage between the device region 101 and device region 102. As illustrated the guard rings 110, 112, with underlying STI trenches 161, 162, are between the device region 101 and device region 102 along the surface. In this manner the guard rings 110, 112 may advantageously spread an electric field due the applied voltage between the device regions 101, 102; and the field spreading may mitigate and/or reduce any deleterious effects of mobile and/or fixed surface charge. Moreover, having the guard rings 110, 112 placed over the STI trenches 161, 162 may advantageously allow for (i.e., sustain) a higher breakdown voltage due, in part, to the insulating material and thickness of insulating material (e.g., $SiO_2$) within the STI trenches 161, 162.

Figure 1E:
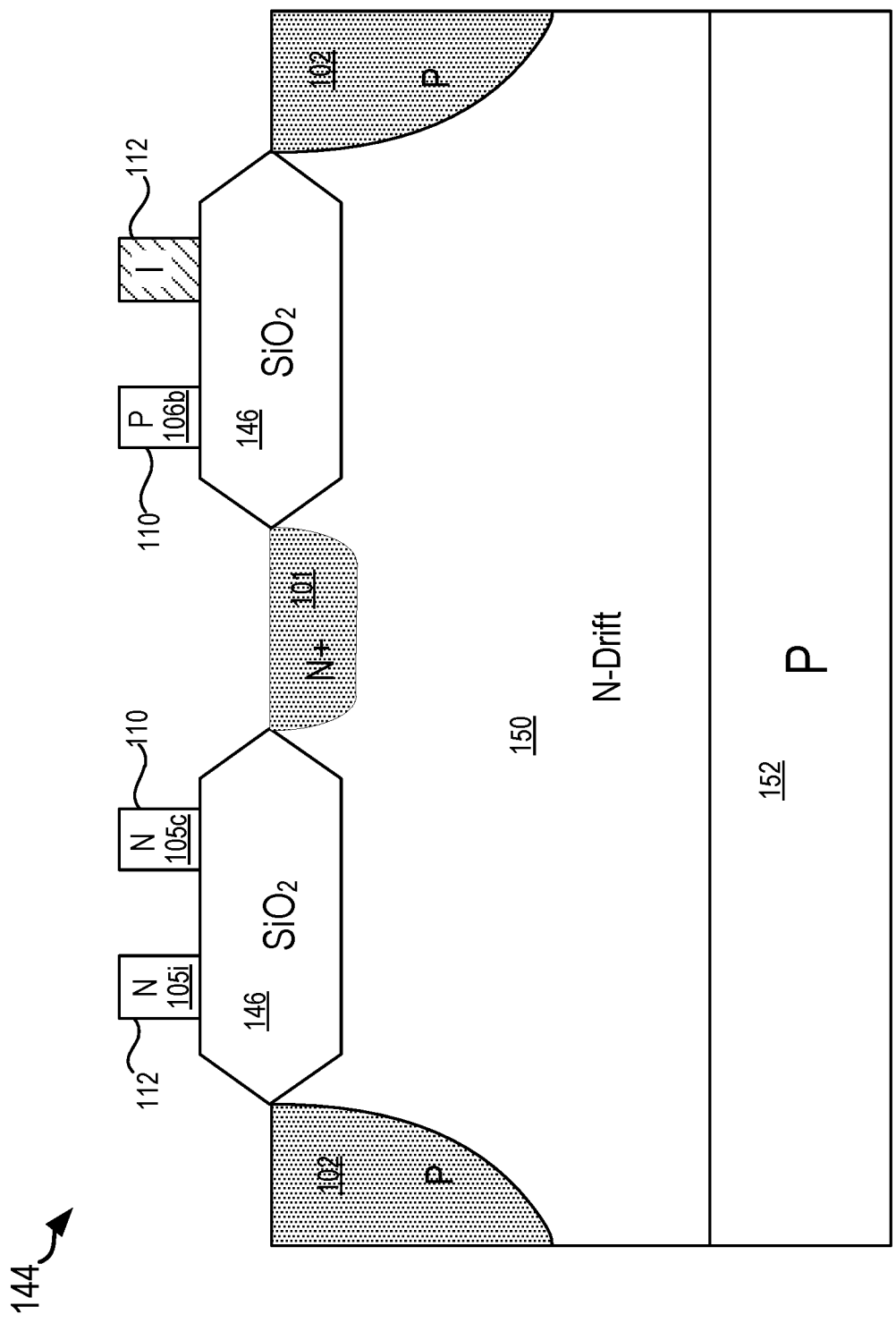
FIG. 1E illustrates a cross section along the slice line of FIG. 1C according to a second embodiment.

FIG. 1E illustrates a cross section 144 along the slice line 142 of FIG. 1C according to a second embodiment. Cross section 144 is similar to cross section 143 except instead of showing an embodiment with STI trenches 161, 162, the cross section 143 shows a second embodiment with field oxide 146. For instance, the field oxide 146 may be a thick field oxide formed during a CMOS process based on a local oxidation of Silicon (LOCOS) process recipe. Instead of being placed over STI trenches 161, 162, the guard rings 110, 112 may be disposed over the field oxide 146 to mitigate and/or reduce any deleterious effects of mobile and/or fixed surface charge.

Figure 1F:
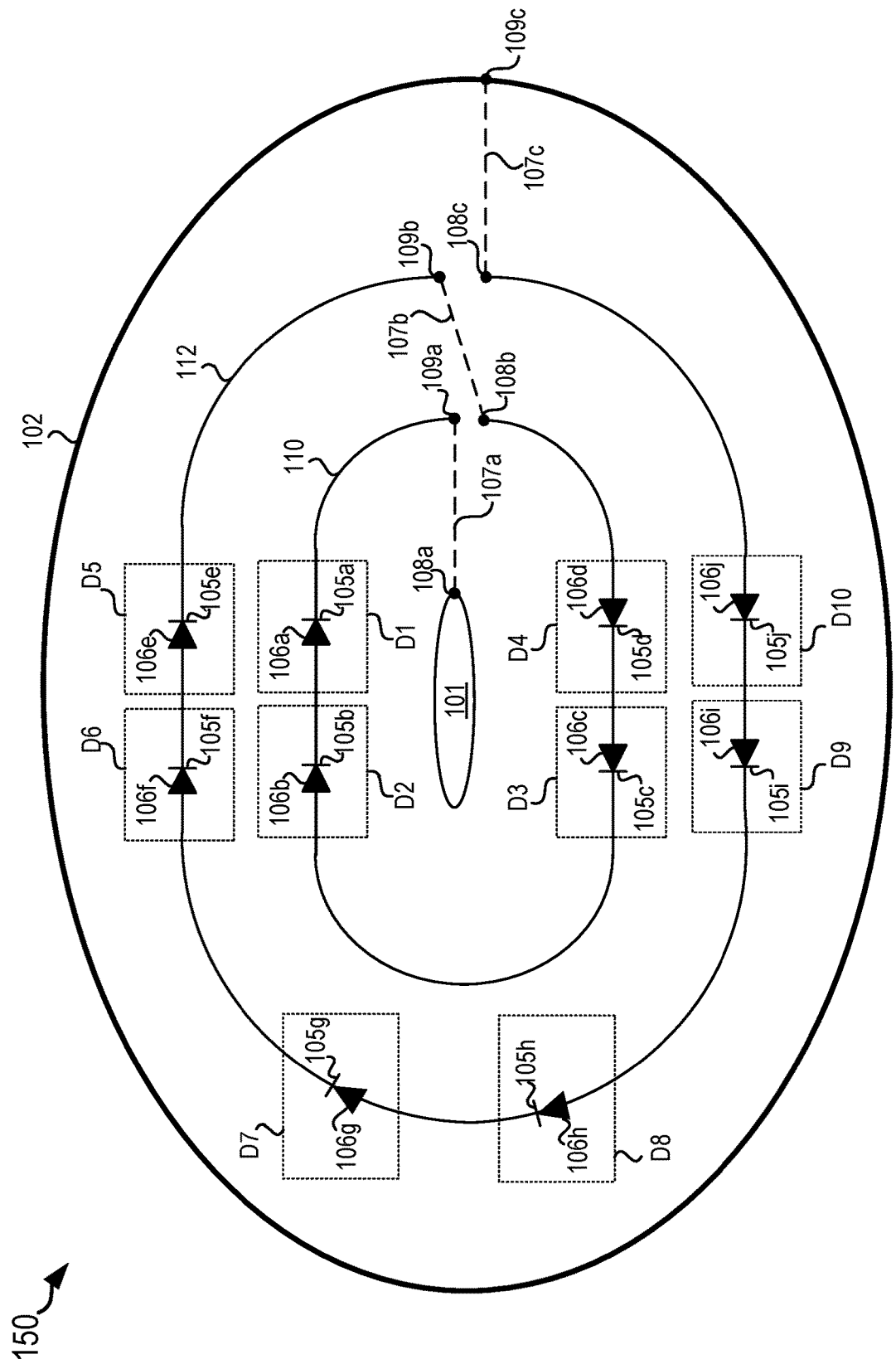
FIG. 1F illustrates a schematic of the simple device structure according to the embodiment of FIG. 1A.

FIG. 1F illustrates a schematic 150 of the simple device structure 100 according to the embodiment of FIG. 1A. Schematic 150 follows from the top view simple device structure 100 and shows the electrical connections of device region 101, device region 102, guard ring 110, and guard ring 112 with interconnect segments 107a-c; and schematic 150 also provides a diode representation with diodes D1-D10 formed by the N-regions 105a-j and P-regions 106a-j.

By comparison to FIG. 1A, the cathode of diode D1 (i.e., N-region 105a) couples to device region 101 by virtue of the interconnect segment 107a and ohmic contacts 108a, 109a. As illustrated diodes D1-D4 are connected in series, and the anode of diode D4 (i.e., P-region 106d) couples to the cathode of diode D5 (i.e., N-region 105e) by virtue of the interconnect segment 107b and ohmic contacts 108b. 109b. Also, diodes D5-D10 are connected in series, and the anode of diode D10 (i.e., P-region 106*j*) couples to device region 102 by virtue of the interconnect segment 107*c* and ohmic contacts 108*c*, 109*c*.

Also, as illustrated by both FIG. 1A and FIG. 1F, diodes may be formed (e.g., implanted) in both curved portions (e.g., curvilinear segments) and linear portions (e.g., straight segments) of the guard rings 110, 112. For instance, diodes D7, D8 are shown as being in a curvilinear (i.e., curved) segment of guard ring 112; and diodes D1, D2 are shown as being in a linear (i.e., straight) segment of guard ring 110.

During device operation there may be an applied voltage between device region 101 and device region 102. Diodes D1-D10 may be placed in the guard rings 110, 112 to distribute the applied voltage along the guard rings 110, 112 without perturbing normal device operation. For instance, as will be further described below with regards to FIG. 4C and FIG. 5C, the diodes D1-D10 may be reverse biased (i.e., operate with reverse bias) to distribute the applied voltage between device region 101 and device region 102.

Figure 1G:
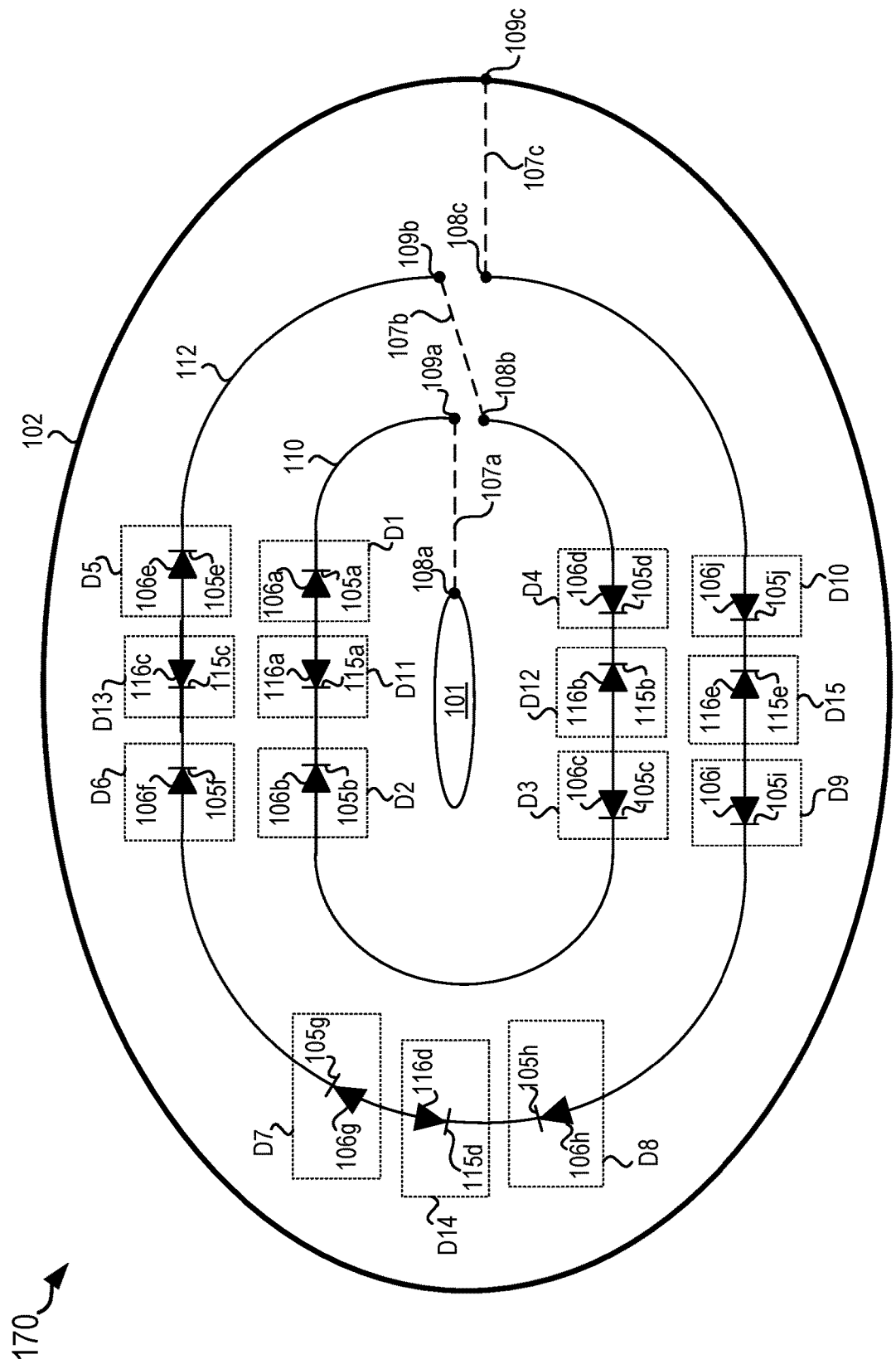
FIG. 1G illustrates a schematic of the simple device structure according to the embodiment of FIG. 1B.

FIG. 1G illustrates a schematic 170 of the simple device structure 113 according to the embodiment of FIG. 1B. Schematic 170 follows from the top view of simple device structure 113 and shows the electrical connections of device region 101, device region 102, guard ring 110, and guard ring 112 with interconnect segments 107*a-c*. Schematic 150 is similar to schematic 170 except it includes the additional diodes D11-D15 formed by the N-regions 115*a-e* and P-regions 116*a-e*. For instance, diode D11 is in series between diodes D1 and D2 such that diodes D1 and D11 are positioned in a back-to-back arrangement; in a back-to-back arrangement; the anode of D11 (i.e., P-region 116*a*) is adjacent (i.e., coupled) to the anode of D1 (i.e., P-region 106*a*). Having diodes placed in a back-to-back arrangement may allow for one or more of the diodes D1-D15 to operate with reverse bias for both positive and negative excursions of an applied voltage. For instance, when an applied voltage between device region 101 and device region 102 is positive, then diodes D1-D10 may be reverse biased while diodes D11-D15 are forward biased (i.e., operate with forward bias); and when the applied voltage is negative, then diodes D11-D15 may be reverse biased while diodes D1-D10 are forward biased.

Figure 2A:
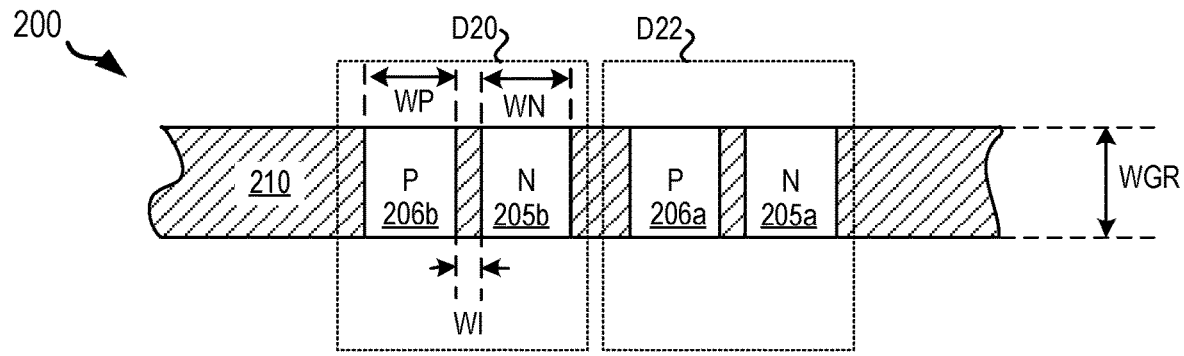
FIG. 2A illustrates a top view of a guard ring segment according to a first embodiment.
Figure 2B:
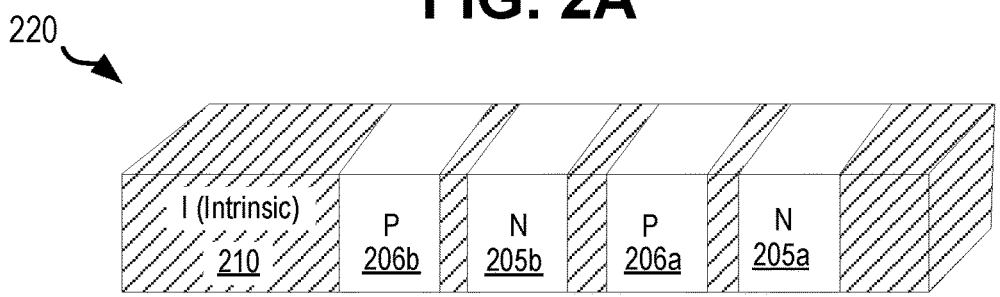
FIG. 2B illustrates a side perspective view of the guard ring segment according to the embodiment of FIG. 2A.

FIG. 2A illustrates a top view 200 of a guard ring segment 210 according to a first embodiment; and FIG. 2B illustrates a side perspective view 220 of the guard ring segment 210 according to the embodiment of FIG. 2A. The top view 200 shows the guard ring segment 210 as having a dimension WGR (e.g., 0.5 microns) and shows the formation of diodes D20, D22 within the guard ring segment 210. As illustrated diode D20 can be formed by an intrinsic region of width WI sandwiched between a P-region 206*b* and an N-region 205*b*, and thus, diode D20 may be referred to as a PIN (p-type, intrinsic, n-type) diode. Diode D22 is also shown as having a PIN diode structure with a P-region 206*a* and an N-region 205*a*.

As discussed above, the N-regions 205*a,b* and P-regions 206*a,b* may be implanted and/or diffused regions. Although the guard ring (i.e., the guard ring segment 210) can be undoped (i.e., intrinsic) polysilicon, in other embodiments the guard ring (i.e., the guard ring segment 210) can also be lightly doped relative to doping concentrations of the N-regions 205*a,b* and P-regions 206*a,b*.

Top view 200 also illustrates a width WP of P-region 206*b* and a width WN of N-region 205*b* to the left and right of the intrinsic (or lightly doped) polysilicon material of width WI. In one embodiment the widths WP, WN, and WI may be determined by critical dimensions and/or design rules; for instance width WP and width WN can have values between zero point one eight (0.18) microns and five microns, and width WI can have values between zero microns and five microns.

Figure 2C:
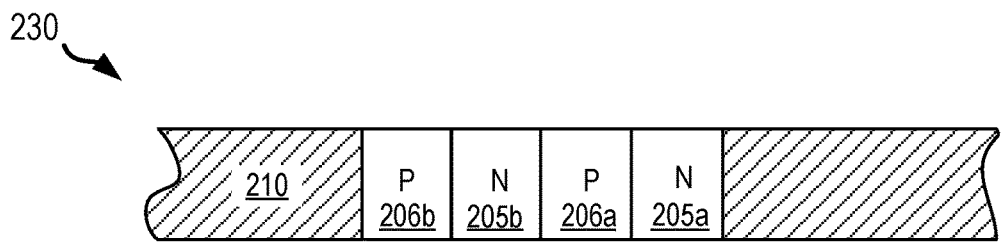
FIG. 2C illustrates a top view of a guard ring segment according to a second embodiment.
Figure 2D:
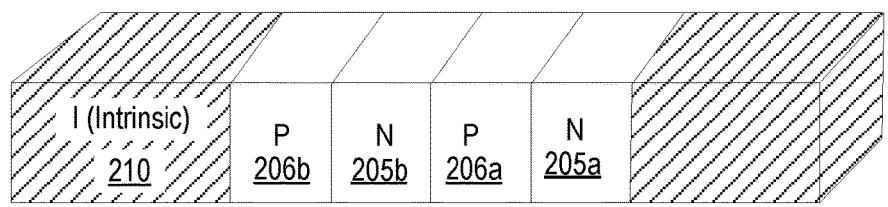
FIG. 2D illustrates a side perspective view of the guard ring segment according to the embodiment of FIG. 2C.

FIG. 2C illustrates a top view 230 of the guard ring segment 210 according to a second embodiment; and FIG. 2D illustrates a side perspective view 240 of the guard ring segment 210 according to the embodiment of FIG. 2C. In the second embodiment the N-regions 205*a,b* and P-regions 206*a, b* are juxtaposed to form PN-junction diodes rather than PIN diodes as drawn in FIG. 2A and FIG. 2B.

Figure 2E:
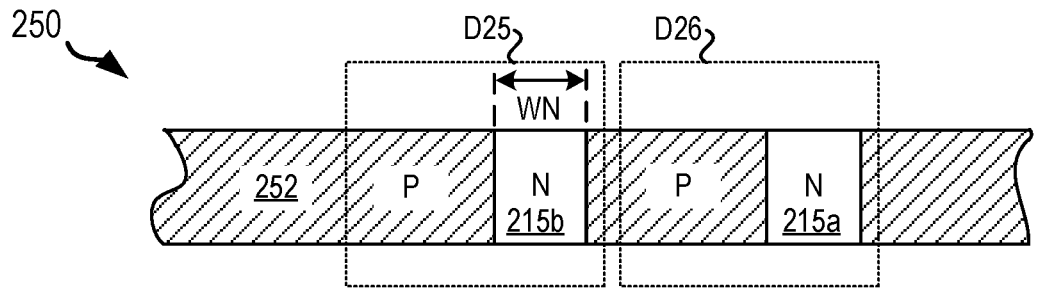
FIG. 2E illustrates a top view of a guard ring segment according to a third embodiment.
Figure 2F:
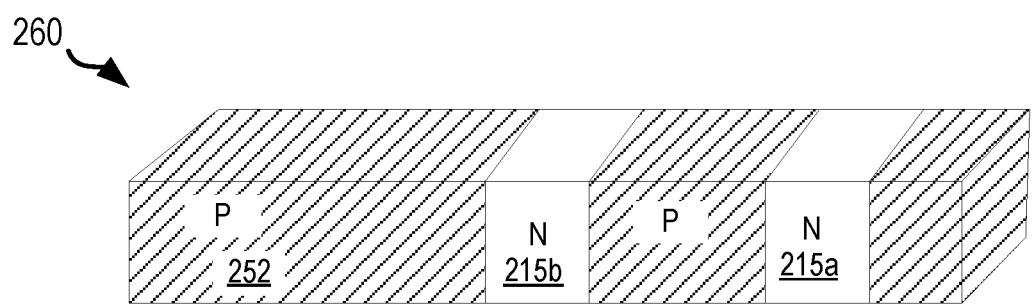
FIG. 2F illustrates a side perspective view of the guard ring segment according to the embodiment of FIG. 2E.

FIG. 2E illustrates a top view 250 of a guard ring segment 252 according to a third embodiment; and FIG. 2F illustrates a side perspective view 260 of the guard ring segment 252 according to the embodiment of FIG. 2E. In the third embodiment a diode D25 and a diode D26 are formed in the guard ring segment 252 using N-region 215*b* and N-region 215*a*, respectively. As illustrated, the guard ring segment 252 may be p-type (P) polysilicon doped prior to implanting and/or diffusing the N-regions 215*a,b*. Additionally, top view 250 illustrates a width WN of N-region 215*b* which may also be determined by critical dimensions and/or design rules.

Figure 2G:
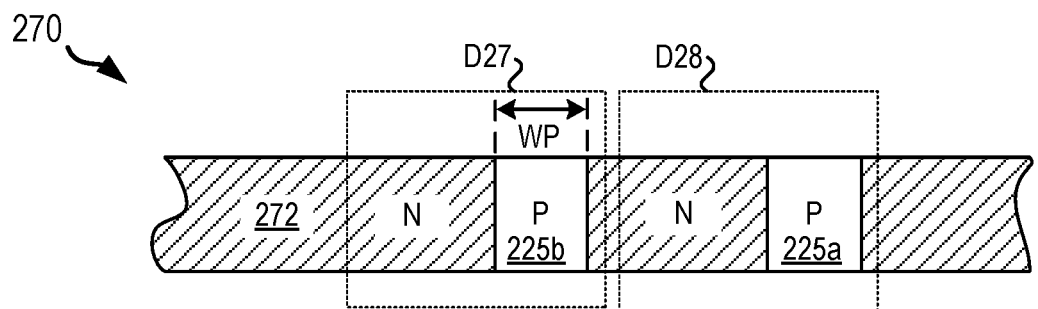
FIG. 2G illustrates a top view of a guard ring segment according to a fourth embodiment.
Figure 2H:
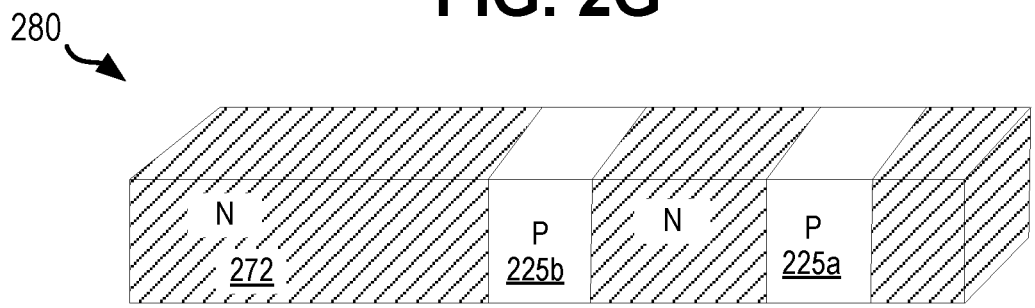
FIG. 2H illustrates a side perspective view of the guard ring segment according to the embodiment of FIG. 2G.

FIG. 2G illustrates a top view 270 of a guard ring segment 272 according to a fourth embodiment; and FIG. 2H illustrates a side perspective view 280 of the guard ring segment 272 according to the embodiment of FIG. 2G. In the fourth embodiment a diode D27 and a diode D28 are formed in the guard ring segment 272 using P-region 225*b* and P-region 225*a*, respectively. As illustrated, the guard ring segment 272 may be n-type (N) polysilicon doped prior to implanting and/or diffusing the P-regions 225*a,b*. Additionally, top view 270 illustrates a width WP of P-region 225*b* which may also be determined by critical dimensions and/or design rules.

Figure 3A:
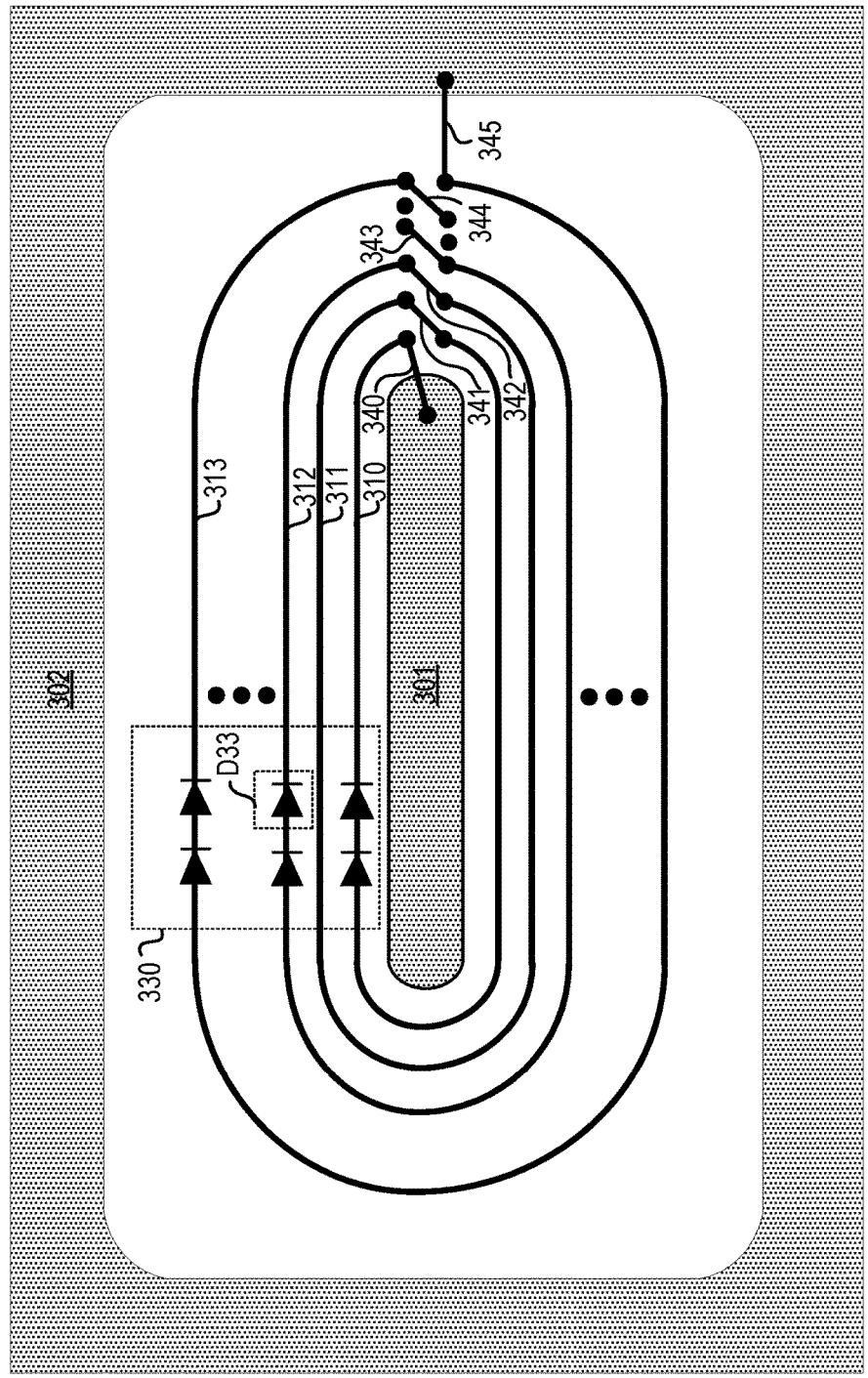
FIG. 3A illustrates a simplified top-view schematic of a simple device structure according to an embodiment.

FIG. 3A illustrates a simplified top-view schematic of a simple device structure 300 according to an embodiment. The simplified top-view schematic depicts guard rings 310-313, interconnect segments 340-345, device regions 301, 302, and a diode array 330. The simplified top-view schematic shows guard rings 310-313 as lines with curvilinear arcs and shows interconnect segments 340-345 as connected lines for ease of presentation; and although the simple device structure shows an embodiment with four guard rings 310-313, there can be greater or fewer than four guard rings 310-313 as necessary to cover a surface region between the device region 301 and the device region 302.

Also as illustrated, the interconnect segments 340-345 couple the guard rings 310-313 in series between the device region 301 and the device region 302. For instance, diode D33 of the diode array 330 is placed within guard ring 312 and has a cathode electrically coupled to guard ring 311 with interconnect segment 342.

During operation, an applied voltage between device region 301 and device region 302 may be distributed along the series connected guard rings 310-313 so that mobile and/or stationary surface charges do not cause breakdown voltage drift. The diode array 330 may be placed using N-regions and P-regions as described above with regards to the embodiments of figures FIG. 1A through FIG. 2H; and the diodes may be in series by virtue of series connected guard rings 310-313.

Figure 3B:
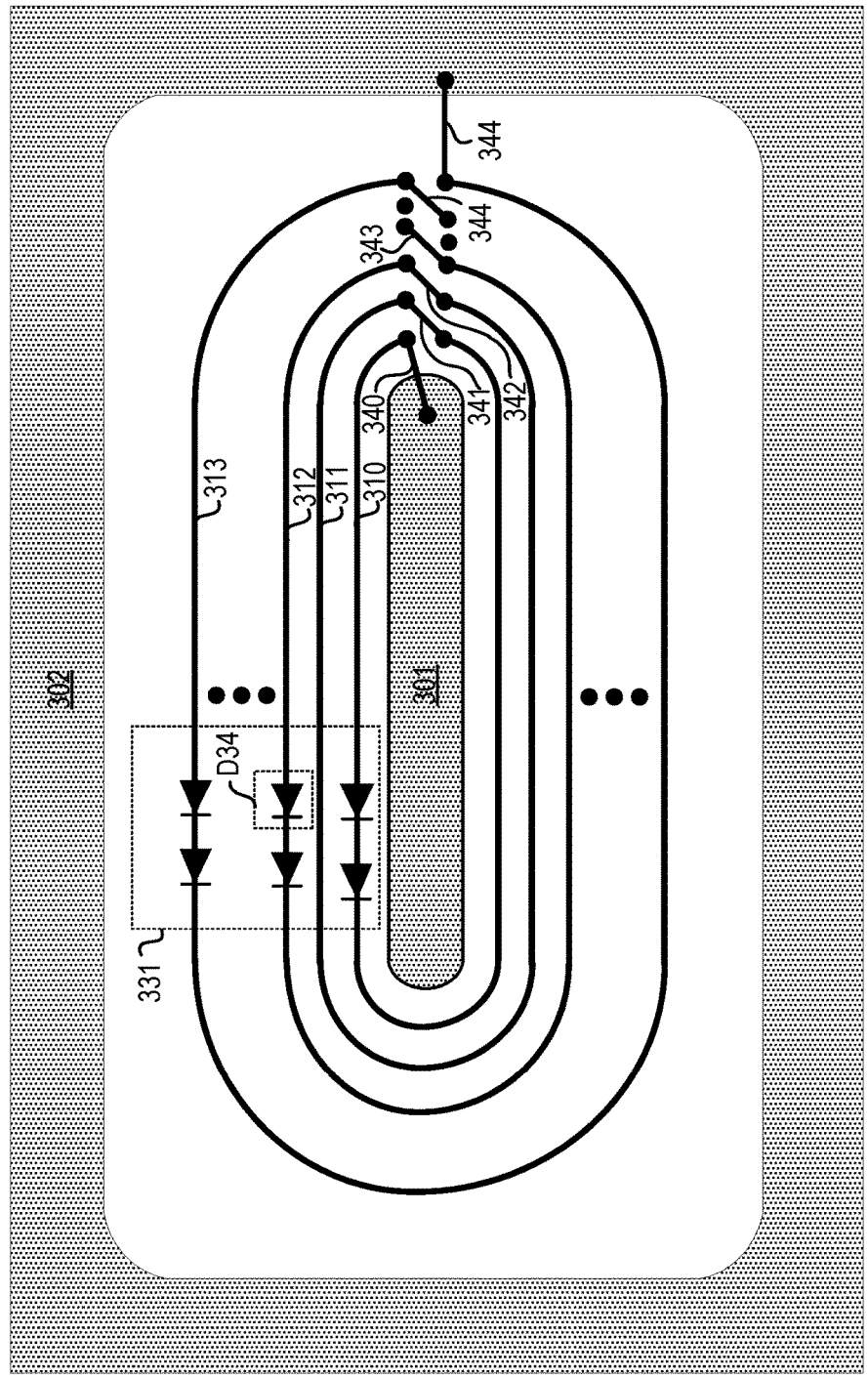
FIG. 3B illustrates a simplified top-view schematic of a simple device structure according to another embodiment.

FIG. 3B illustrates a simplified top-view schematic of a simple device structure 360 according to another embodiment. The simple device structure 360 is similar to that of device structure 300, except it uses a diode array 331 with diodes oriented in the opposite direction as those shown in FIG. 3A. For instance, diode D34 is oriented such that its anode is electrically coupled with guard ring 311 by the interconnect segment 342. Having the diode array 331 placed with diodes oriented in the opposite direction may advantageously allow for device operation with an applied voltage opposite in sign to that used with device structure 300.

Figure 3C:
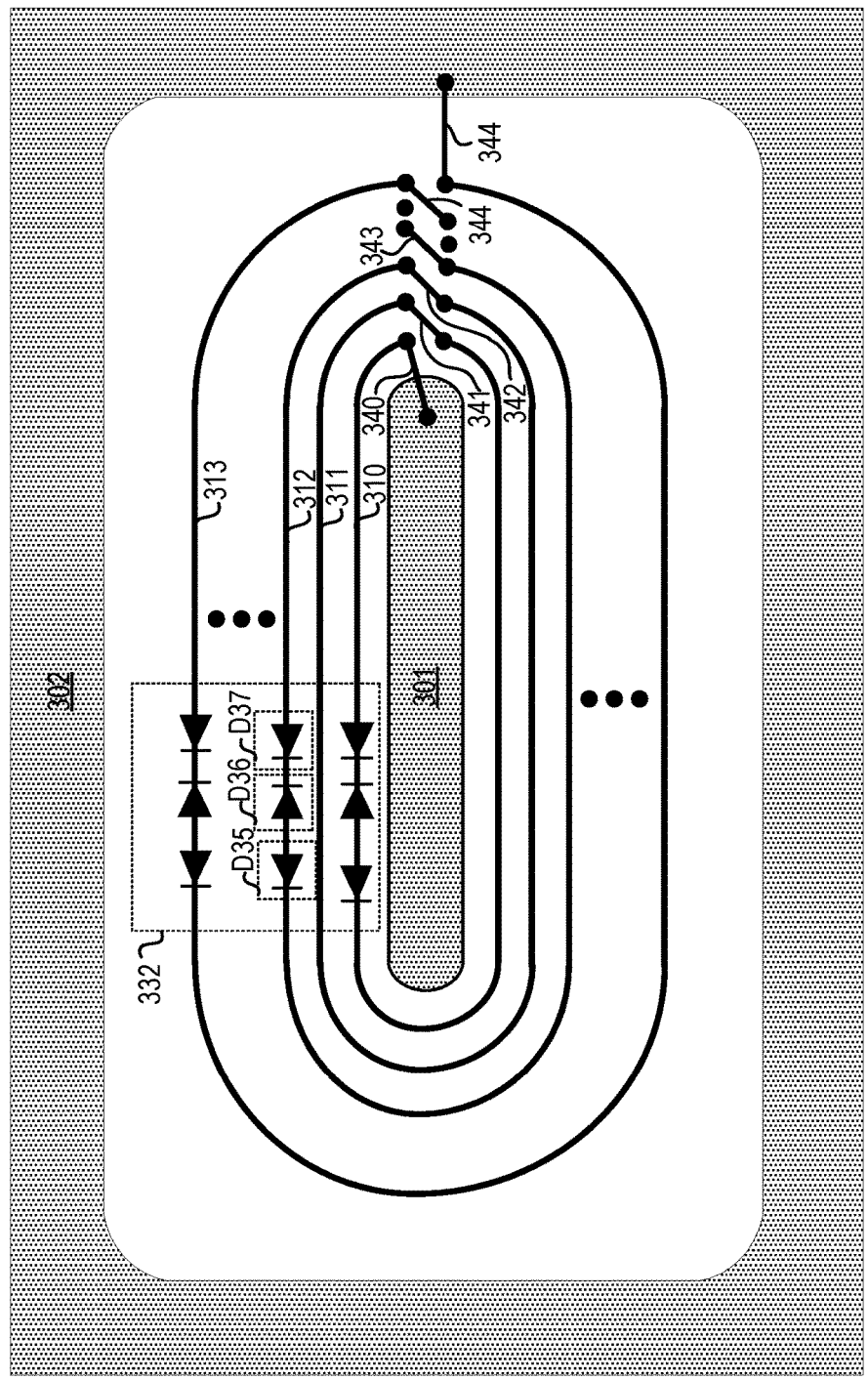
FIG. 3C illustrates a simplified top-view schematic of a simple device structure according to another embodiment.

FIG. 3C illustrates a simplified top-view schematic of a simple device structure 370 according to another embodiment. The simple device structure 370 is similar to that of device structure 300 and device structure 360, except it uses a diode array 332 with diodes oriented in both directions. For instance, diodes D35, D36, and D37 are placed with diode D36 opposite in direction to that of diodes D35 and D37; and as illustrated, D35 and D36 are positioned as back-to-back diodes (i.e., the anodes of D35 and D36 are electrically coupled).

Figure 4A:
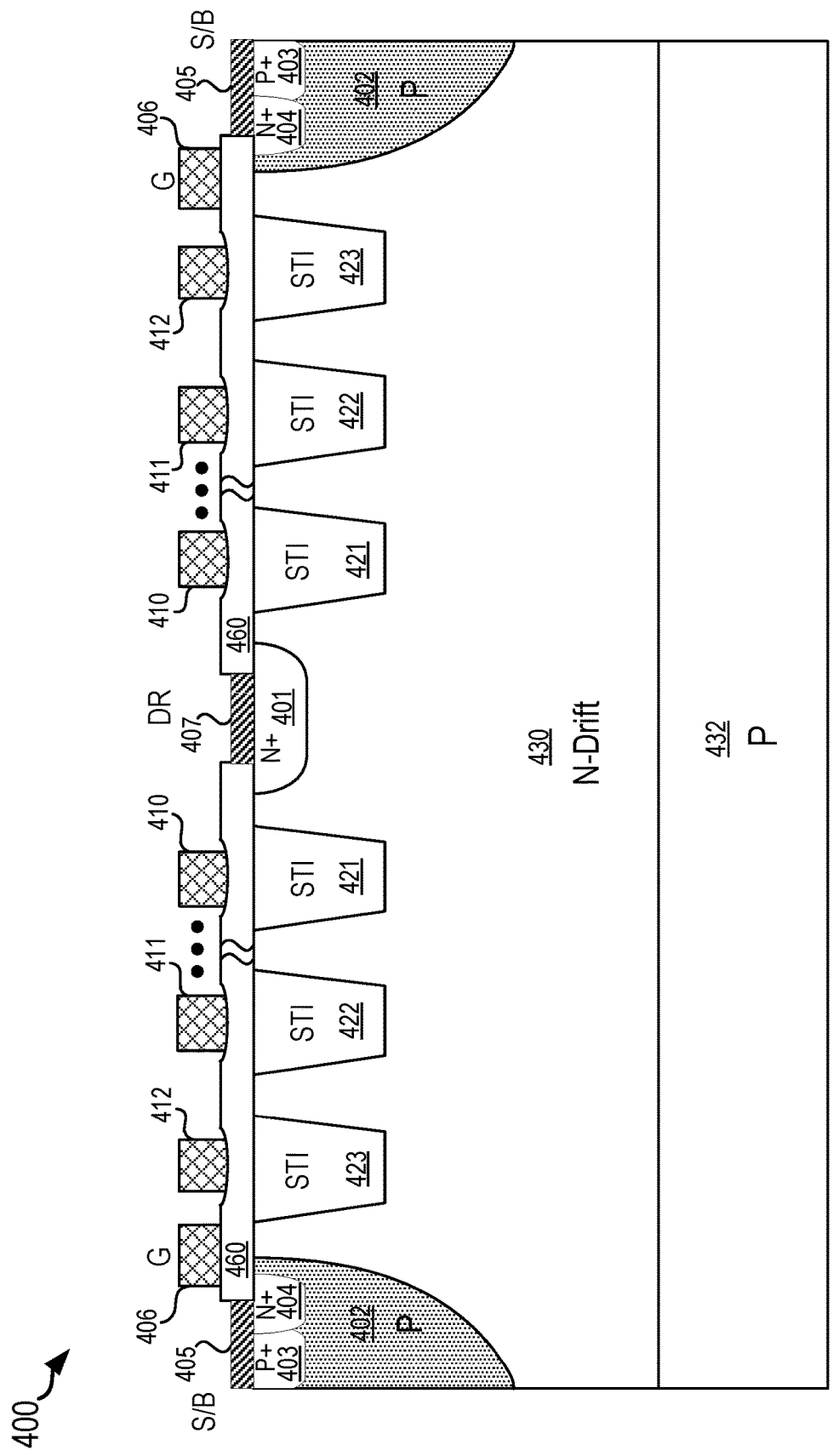
FIG. 4A illustrates a device cross section according to an embodiment.

FIG. 4A illustrates a device cross section 400 according to an embodiment. The embodiment of device cross section 400 can be similar to cross section 143, except it shows more detail relating to a power device with gate control (e.g., an LDMOS). Device cross section 400 includes a P-layer 432, an N-drift region 430, a device region 401, a device region 402, a polysilicon gate 406. STI trenches 421-423, guard rings 410-412, an ohmic contact 405, and an ohmic contact 407.

As illustrated device region 402 can be a p-type (P) region. Also as illustrated device region 402 includes a P+ region 403 and an N+ region 404. In regards to forming a power device (e.g., an LDMOS), device region 402 with the P+ region 403 may form a body; and electrical contact to the body may be availed by ohmic contact 405. The polysilicon gate 406 with the underlying oxide 460 (i.e., gate oxide) may functionally form a gate; and when a gate voltage is applied to the polysilicon gate 406, a channel (i.e., an N-channel) may be controlled in the device region 402 adjacent the N+ region 404 (i.e., the source). As shown the ohmic contact 405 may electrically couple the N+ region 404 and the P+ region 403 together to form a source/body (S/B) connection.

Also as illustrated device region 401 can be a heavily doped n-type (N+) region. In regards to forming a power device (e.g., an LDMOS), the N-drift region 430 with the device region 401 may form a drain (DR); and electrical contact to the drain may be availed by ohmic contact 407. When a gate voltage is applied to gate 406 to effectuate a channel, current can flow laterally between the drain and source across the N-drift region 430. Alternatively, when a gate voltage is applied to gate 406 to form a barrier, a voltage may be sustained across the N-drift region 430 for electric fields less than a critical field.

When the guard rings 410-412 include PN-junctions according to the teachings herein, the guard rings 410-412 overlaying STI trenches 421-423 may advantageously enhance the voltage sustained across the N-drift region 430 and improve the maximum breakdown voltage. Maximum breakdown voltage may be enhanced by spreading electric fields between device region 401 and device region 402; and according to the teachings herein, the PN-junctions may be formed for reverse bias operation. Forming PN-junctions in the guard rings 410-412 such that one or more of them operate in reverse bias may advantageously enhance device breakdown without intruding on device performance. For instance, as will be further illustrated below in FIG. 4C, having diodes which operate in reverse bias, the guard rings 410-412 may advantageously distribute voltage without significantly impacting reverse leakage current.

As discussed above, in some embodiments the number and/or density of guard rings 410-412 and underlying STI trenches 421-423 may be selected based on process defined critical dimensions and spacing rules (e.g., an OD layer requirement and/or critical dimension); and although FIG. 4A illustrates a device cross section 400 according to an embodiment showing an N-drift region 430 having three STI trenches 421-423 underlying three guard rings 410-412, other configurations are possible. For instance, there could be greater or fewer than three STI trenches 421-423 underlying three guard rings 410-412 based on dimensions of the N-drift region 430. Dimensions of the N-drift region 430 may be selected based on a desired breakdown voltage.

Additionally, as one of ordinary skill in the art may appreciate, a power device may be formed with opposite polarity type. For instance, an LDMOS may be formed to be as a P-channel device with a P-drift region rather than an N-drift region 430.

Figure 4B:
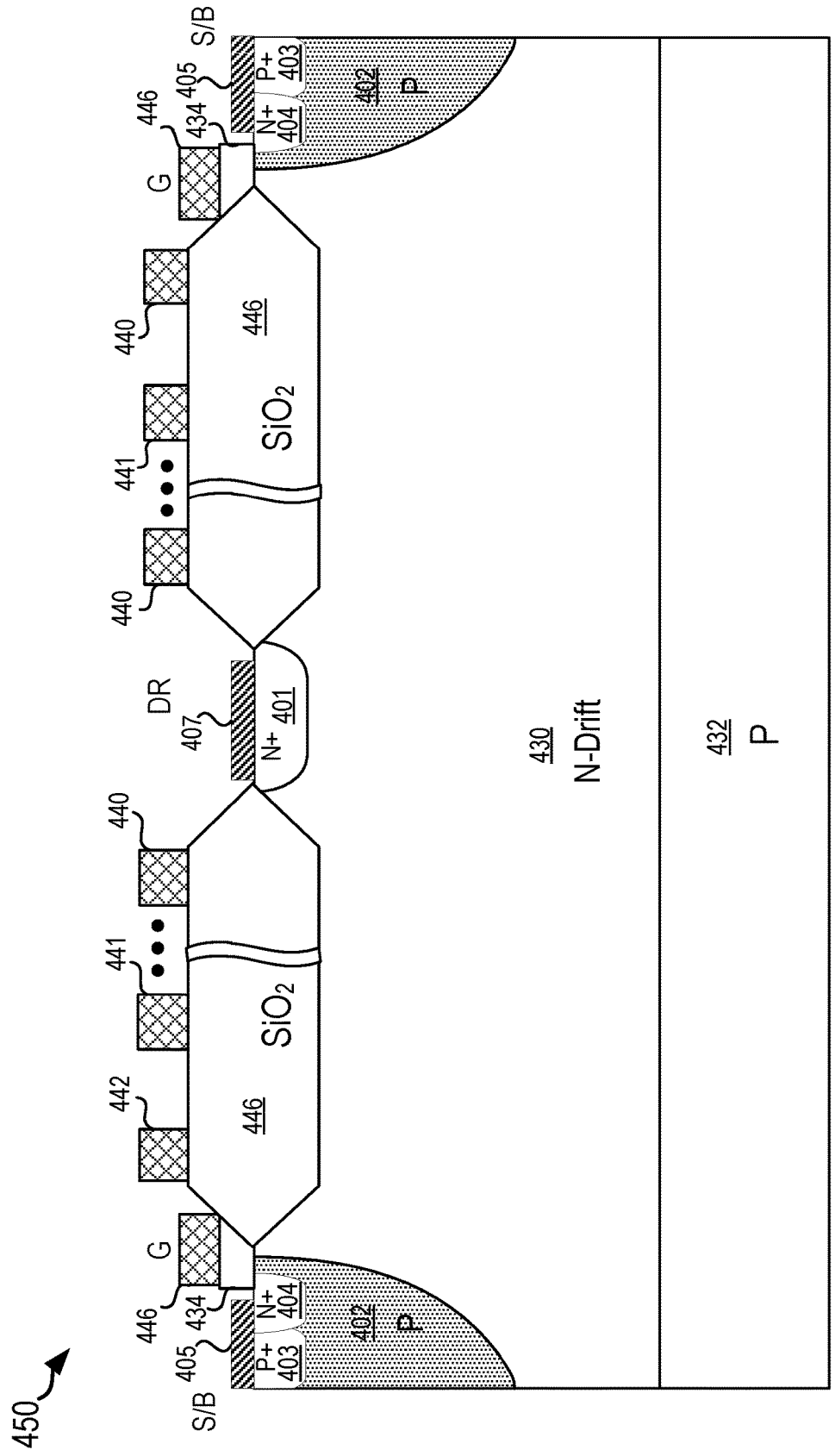
FIG. 4B illustrates a device cross section according to another embodiment.

FIG. 4B illustrates a device cross section 450 according to another embodiment. The embodiment of device cross section 450 is similar to that of device cross section 400 except the process uses field oxide 446 instead of STI trenches 421-423. For instance, the field oxide 446 may be formed in a CMOS process using a LOCOS process recipe. The field oxide 446 may have a higher dielectric breakdown strength relative to a gate oxide 434; and the guard rings 440-442 may, like guard rings 410-412, be placed to spread electric fields at and/or near the surface of the N-drift region 430. Also, when the guard rings 440-442 include PN-junctions according to the teachings herein, the guard rings 440-442, overlaying the field oxide 446, may advantageously enhance the voltage sustained across the N-drift region 430 and improve the maximum breakdown voltage.

Also, as discussed above, in some embodiments the number and/or density of guard rings 440-442 may be selected based on process defined critical dimensions and spacing rules relating to a LOCOS process recipe. Additionally, the embodiment of device cross section 450, like the embodiment of device cross section 400, should not be considered limiting. For instance, there can be greater and/or fewer than three guard rings 440-442; and opposite polarity power devices (e.g., a P-type LDMOS) may also be possible.

Figure 4C:
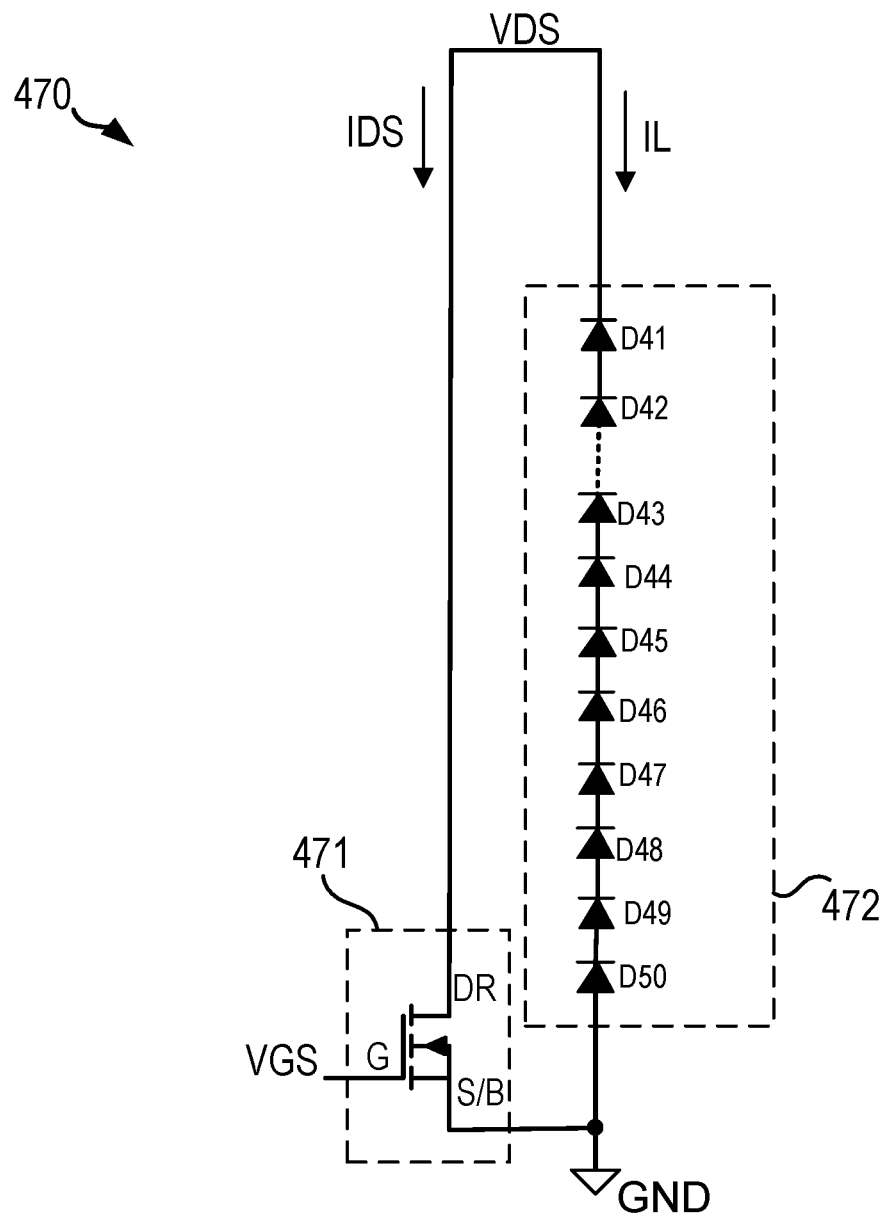
FIG. 4C illustrates a schematic corresponding to an embodiment of a device.

FIG. 4C illustrates a schematic 470 corresponding to an embodiment of a device. For instance, the embodiment can be a power device (e.g., an LDMOS) as depicted by cross section 400 of FIG. 4A and/or cross section 450 of FIG. 4B. The embodiment of schematic 470 includes an LDMOS 471 which has a gate G, drain DR, and connected source/body S/B. With reference to FIG. 4A and/or FIG. 4B, the gate G may correspond with polysilicon gate 406 and/or polysilicon gate 446; the drain DR may correspond with and include the region(s) (e.g., device region 401) electrically coupled by ohmic contact 407, and the source/body S/B may correspond with and include the connected regions (e.g., N+ and P+ regions 404, 403) electrically coupled by ohmic contact 405.

As illustrated, the embodiment may include a diode array 472 electrically connected in parallel with the drain DR and connected source/body S/B of the LDMOS 471. The diode array 472 comprises a plurality of series connected diodes D41-D50 which may correspond with PN-junctions placed (e.g., diffused) within the guard rings 410-412 and/or guard rings 440-442. As shown, a cathode of diode D41 (e.g., an N region of a guard ring) electrically connects to the drain DR of the LDMOS 471; and an anode of diode D50 (e.g., a P region of a guard ring) electrically connects to the source/body S/B of LDMOS 471.

Also as illustrated the connected source/body S/B of LDMOS 471 is electrically coupled (i.e., referenced) to ground GND; and in this way a drain-to-source voltage VDS and a gate-to-source voltage VGS may likewise be referenced with respect to ground GND. As illustrated the drain-to-source voltage VDS and the gate-to-source voltage VGS are respectively coupled to the drain DR and the gate G of LDMOS 471. When the gate-to-source voltage VGS is less than a threshold voltage (e.g., two volts) of the LDMOS 471, a drain-to-source current IDS may ideally be limited to very low values (e.g., on-the-order-of and/or less-than a microampere). Alternatively, when the gate-to-source voltage VGS is greater than the threshold voltage of LDMOS 471, then the drain-to-source current IDS may ideally be large (e.g., on-the-order-of amperes).

According to the teachings herein, the diode array 472 may formed within guard rings (e.g., guard rings 410-412 and/or guard rings 440-442) and electrically coupled with the LDMOS 471 such that the guard rings mitigate breakdown voltage drift without interfering with device operation and/or characteristics. For instance, the diodes D41-D50 are electrically connected in series such that when VDS is greater than zero, the diodes D41-D50 operate in reverse bias. The number of diodes D41-D50 may be selected such that a reverse leakage current IL is low relative to an off-state value of the drain-to-source current IDS. The off-state value of IDS may correspond with the condition that the gate-to-source voltage VGS is less than a threshold voltage (e.g., two volts). For instance, the number of diodes D41-D50 may be selected such that the reverse leakage current IL is substantially zero and/or substantially less than the drain-to-source current IDS when the gate-to-source voltage is less than the threshold voltage for specified values of the drain-to-source voltage VDS (e.g., seven-hundred volts).

Figure 4D:
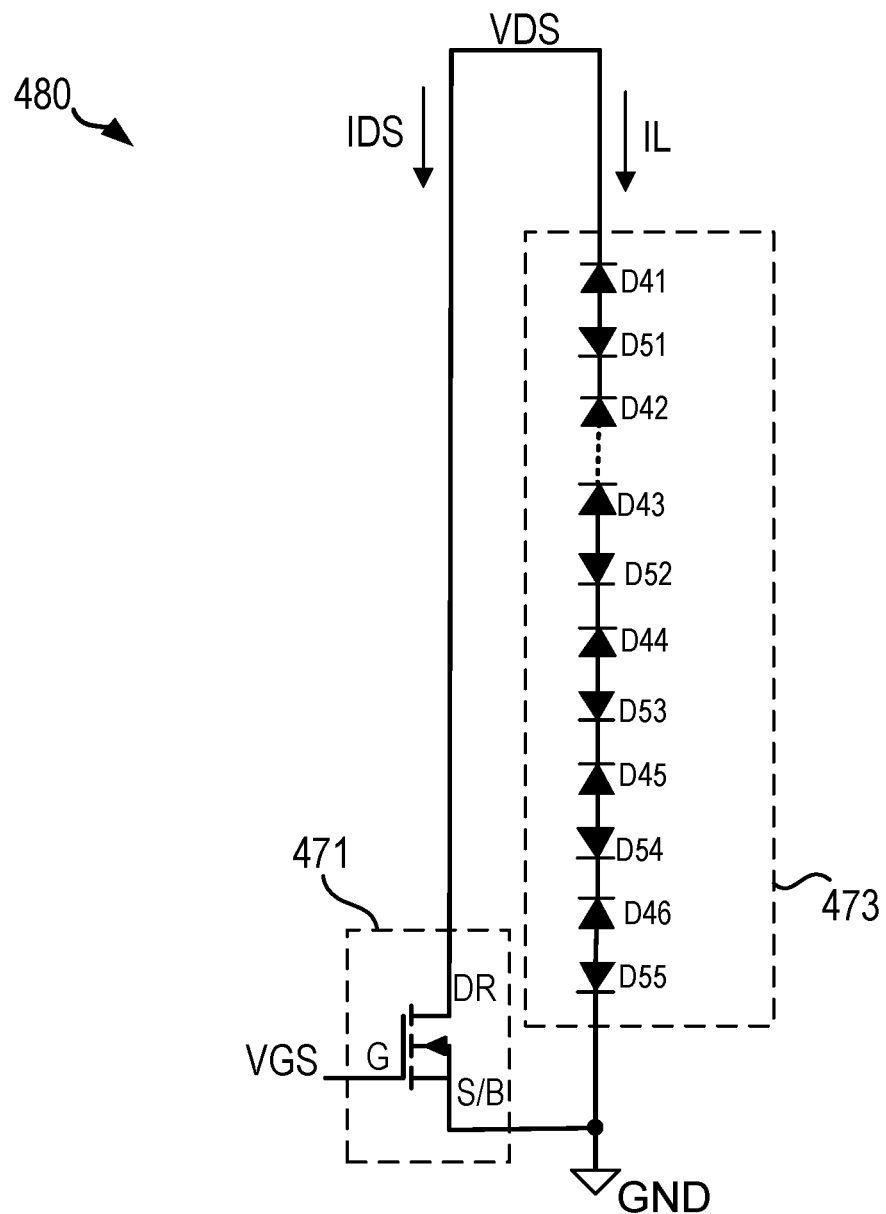
FIG. 4D illustrates a schematic corresponding to another embodiment of a device.

FIG. 4D illustrates a schematic 480 corresponding to another embodiment of a device. The device may also be a power device as depicted by cross section 400 of FIG. 4A and/or cross section 450 of FIG. 4B, except diode array 473 replaces diode array 472. Unlike diode array 472, diode array 473 includes series coupled diodes D41-D46 and diodes D51-D55 oriented in opposite directions. For instance, diode D41 and diode D51 are electrically coupled in a back-to-back arrangement. Also as illustrated, a cathode of diode D41 is electrically coupled to the drain DR of LDMOS 471 and a cathode of diode D55 is electrically coupled to the source/body S/B of LDMOS 471. Accordingly, when the drain-to-source voltage VDS is greater than zero, then diodes D41-D46 may operate in reverse bias to limit a leakage current IL. Additionally, when the drain-to-source voltage VDS is less than zero then diodes D51-D55 may also advantageously limit the leakage current IL by operating in reverse bias.

Figure 5A:
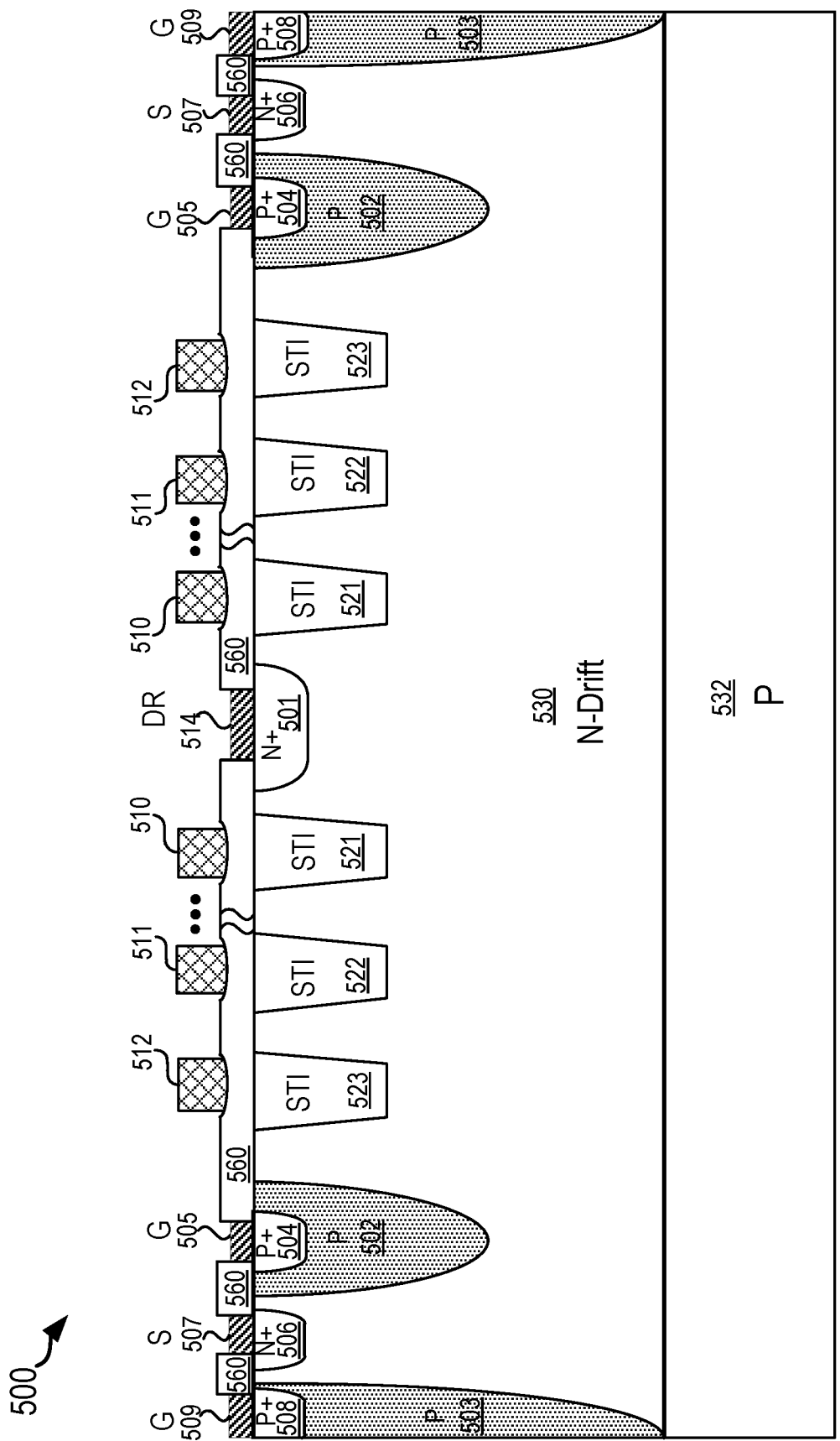
FIG. 5A illustrates a device cross section according to an embodiment.

FIG. 5A illustrates a device cross section 500 according to an embodiment. The embodiment of device cross section 500 can also be similar to cross section 143, except it shows more detail relating to a power device where the gate may be formed by a junction (e.g., a JFET). Device cross section 500 includes a P-layer 532, an N-drift region 530, a device region 501, a device region 502, a well region 503, STI trenches 521-523, guard rings 510-512, an ohmic contact 505, an ohmic contact 507, an ohmic contact 509, and a surface oxide 560.

As illustrated device region 502 and well region 503 can be p-type (P) regions. Device region 502 may include a P+ region 504 to electrically couple with ohmic contact 505; and well region 503 may include a P+ region 508 to electrically couple with ohmic contact 509. Additionally, the N-drift region includes an N+ region 506 between the device region 502 and well region 503; and as shown device region 501 may also be a heavily doped n-type (N+) region.

In regards to forming a power device (e.g., a JFET), device region 502, P+ region 504, and ohmic contact 505 may electrically function as part of a JFET gate (G); and the well region 503. P+ region 508, and ohmic contact 509 may electrically function as part of the JFET gate (G). Also, the N+ region 506, may electrically couple with ohmic contact 507 to electrically function as a source(S); and N-drift region with the device region 501 and its ohmic contact 514 may electrically function as a drain (DR). According to semiconductor device physics, electron current from the source (e.g., the N+ region 506) may be controlled by a gate voltage electrically coupled at the ohmic contacts 505, 509. The well region 503 and device region 502 may create a depletion and/or pinched region in response to the gate voltage to control (i.e., to gate) electron current flowing laterally within the N-drift region 530. When a gate voltage is applied to gate to form a barrier, a voltage may be sustained across the N-drift region 530 for electric fields less than a critical field.

When the guard rings 510-512 include PN-junctions according to the teachings herein, the guard rings 510-512 overlaying STI trenches 521-523 may advantageously enhance the voltage sustained across the N-drift region 530 and improve the maximum breakdown voltage. Maximum breakdown voltage may be enhanced by spreading electric fields between device region 501 and device region 502; and according to the teachings herein, the PN-junctions may be formed for reverse bias operation. Forming PN-junctions in the guard rings 510-512 such that one or more of them operate in reverse bias may advantageously enhance device breakdown without intruding on device performance. For instance, as will be further illustrated below in FIG. 5C, having diodes which operate in reverse bias the guard rings 510-512 may advantageously distribute voltage without significantly impacting reverse leakage current.

As discussed above, in some embodiments the number and/or density of guard rings 510-512 and underlying STI trenches 521-523 may be selected based on process defined critical dimensions and spacing rules (e.g., an OD layer requirement); and although FIG. 5A illustrates a device cross section 500 according to an embodiment showing an N-drift region 530 having three STI trenches 521-523 underlying three guard rings 510-512, other configurations are possible. For instance, there could be greater or fewer than three STI trenches 521-523 underlying three guard rings 510-512 based on dimensions of the N-drift region 530. One or more dimensions of the N-drift region 530 may be selected based on a desired breakdown voltage.

Additionally, as one of ordinary skill in the art may appreciate, a power device may be formed with opposite polarity type. For instance, a JFET may be formed in a P-drift region rather than an N-drift region 530.

Figure 5B:
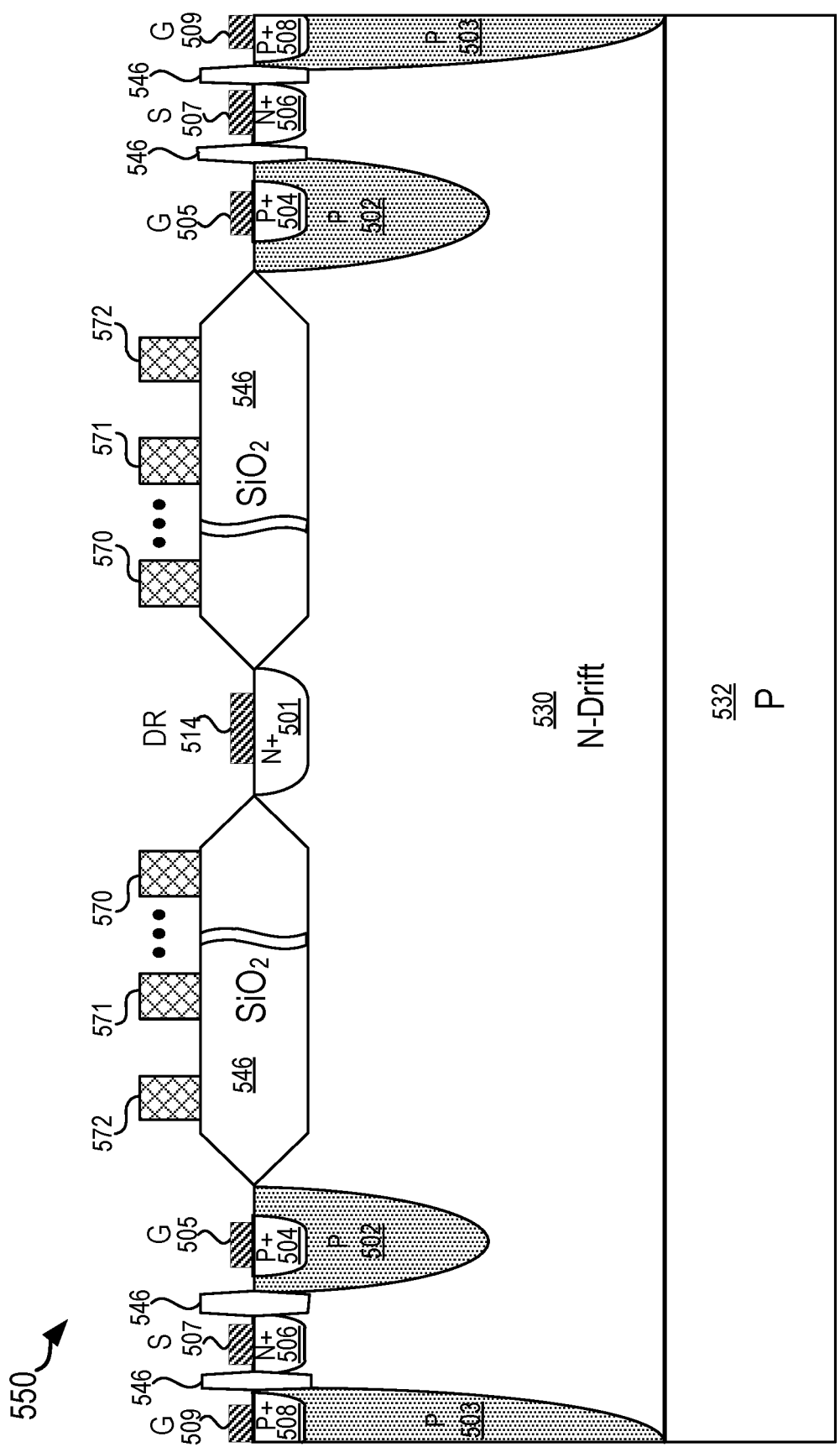
FIG. 5B illustrates a device cross section according to another embodiment.

FIG. 5B illustrates a device cross section 550 according to another embodiment. The embodiment of device cross section 550 is similar to that of device cross section 500 except the process uses field oxide 546 instead of STI trenches 521-523. For instance, the field oxide 546 may be formed in a CMOS process using a LOCOS process recipe. The field oxide 546 may have a higher dielectric breakdown strength relative to the surface oxide 560 of cross section 500; and the guard rings 570-572 may, like guard rings 510-512, be placed to spread electric fields at and/or near the surface of the N-drift region 530. Also, when the guard rings 570-572 include PN-junctions according to the teachings herein, the guard rings 570-572, overlaying the field oxide 546, may advantageously enhance the voltage sustained across the N-drift region 530 and improve the maximum breakdown voltage.

Also, as discussed above, in some embodiments the number and/or density of guard rings 570-572 may be selected based on process defined critical dimensions and spacing rules relating to a LOCOS process recipe. Additionally, the embodiment of device cross section 550, like the embodiment of device cross section 500, should not be considered limiting. For instance, there can be greater and/or fewer than three guard rings 570-572; and opposite polarity power devices may also be possible.

Figure 5C:
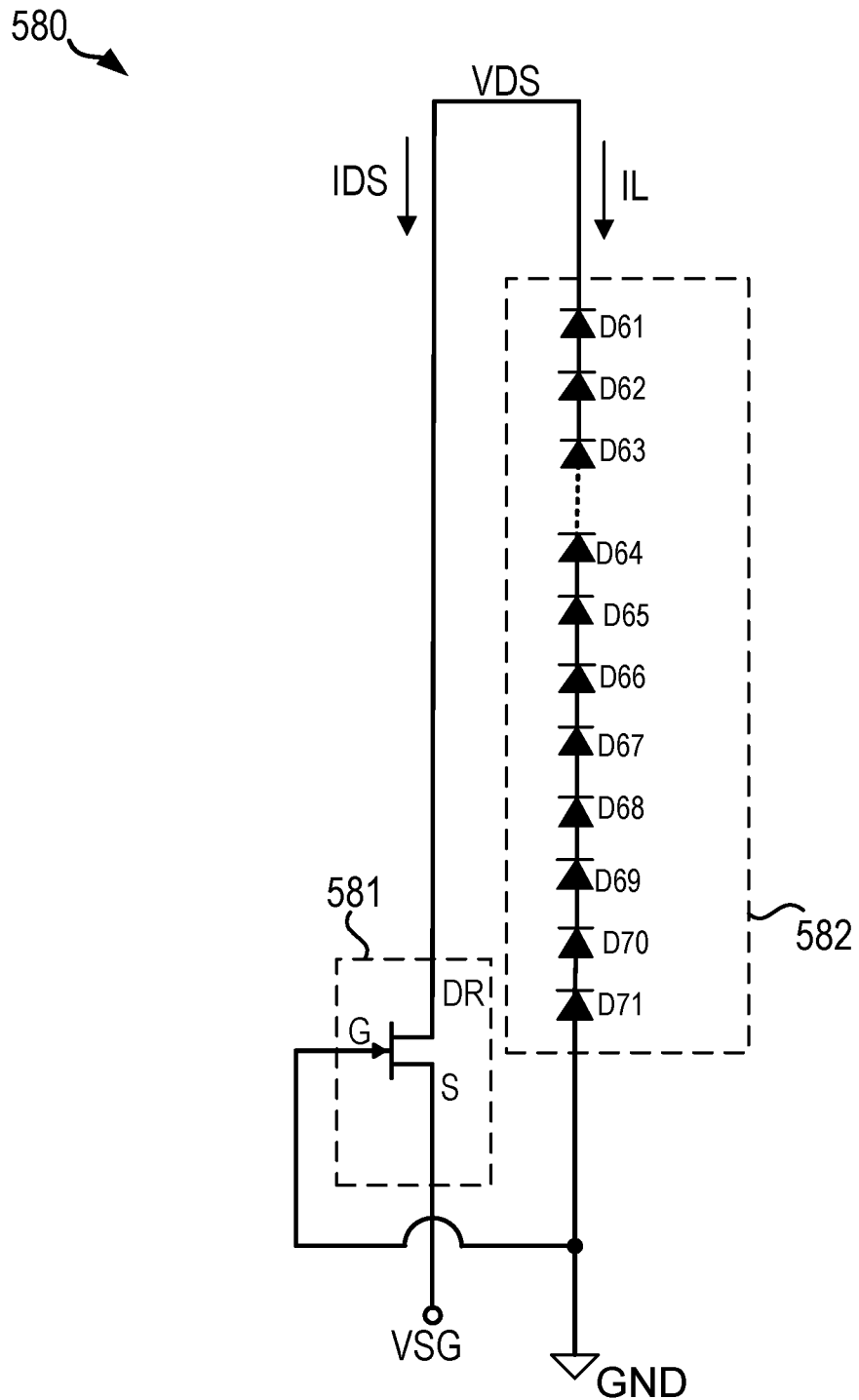
FIG. 5C illustrates a schematic corresponding to an embodiment of a device.

FIG. 5C illustrates a schematic 580 corresponding to an embodiment of a device. For instance, the embodiment can be a power device (e.g., a JFET) as depicted by cross section 500 of FIG. 5A and/or cross section 550 of FIG. 5B. The embodiment of schematic 580 includes a JFET 581 which has a gate G, drain DR, and source S. With reference to FIG. 5A and/or FIG. 5B, the gate G may correspond with and include the regions (e.g., device region 502 and well region 503) coupled by ohmic contacts 505, 509; the drain DR may correspond with and include the region(s) (e.g., device region 501) electrically coupled by ohmic contact 514, and the source S may correspond with and include the regions (e.g., N+ region 506) electrically coupled by ohmic contact 507.

As illustrated, the embodiment may include a diode array 582 electrically connected in parallel with the drain DR and gate G of the JFET 581. The diode array 582 comprises a plurality of series connected diodes D61-D71 which may correspond with PN-junctions placed (e.g., diffused) within the guard rings 510-512 and/or guard rings 570-572. As shown, a cathode of diode D61 (e.g., an N region of a guard ring) electrically connects to the drain DR of JFET 581; and an anode of diode D71 (e.g., a P region of a guard ring) electrically connects to the gate G of JFET 581.

Also as illustrated the gate of JFET 581 is electrically coupled (i.e., referenced) to ground GND; and in this way a drain-to-source voltage VDS and a source-to-gate voltage VSG may likewise be referenced with respect to ground GND. As illustrated the drain-to-source voltage VDS and the source-to-gate voltage VSG are respectively coupled to the drain DR and the source S of JFET 581. When the source-to-gate voltage VSG exceeds a pinch-off voltage (e.g., four volts) of the JFET 581, a drain-to-source current IDS may ideally be limited to very low values (e.g., on-the-order-of and/or less-than a microampere). Alternatively, when the source-to-gate voltage VSG is greater than the pinch-off voltage of JFET 581, then the drain-to-source current IDS may ideally be large (e.g., on-the-order-of amperes).

According to the teachings herein, the diode array 582 may formed within guard rings (e.g., guard rings 510-512 and/or guard rings 570-572) and electrically coupled with the JFET 581 such that the guard rings mitigate breakdown voltage drift without interfering with device operation and/or characteristics. For instance, the diodes D61-D71 are electrically connected in series such that when VDS is greater than zero, the diodes D61-D71 operate in reverse bias. The number of diodes D61-D71 may be selected such that a reverse leakage current IL is low relative to an off-state value of the drain-to-source current IDS. The off-state value of IDS may correspond with the condition that the source-to-gate voltage VSG is greater than a pinch-off voltage (e.g., four volts). For instance, the number of diodes D61-D71 may be selected such that the reverse leakage current IL is substantially zero (e.g., one-tenth and/or one-hundredth of a microampere) and/or substantially less than the drain-to-source current IDS (e.g., one microampere) when the source-to-gate voltage exceeds a pinch-off voltage for specified values of the drain-to-source voltage VDS (e.g., seven-hundred volts).

Figure 5D:
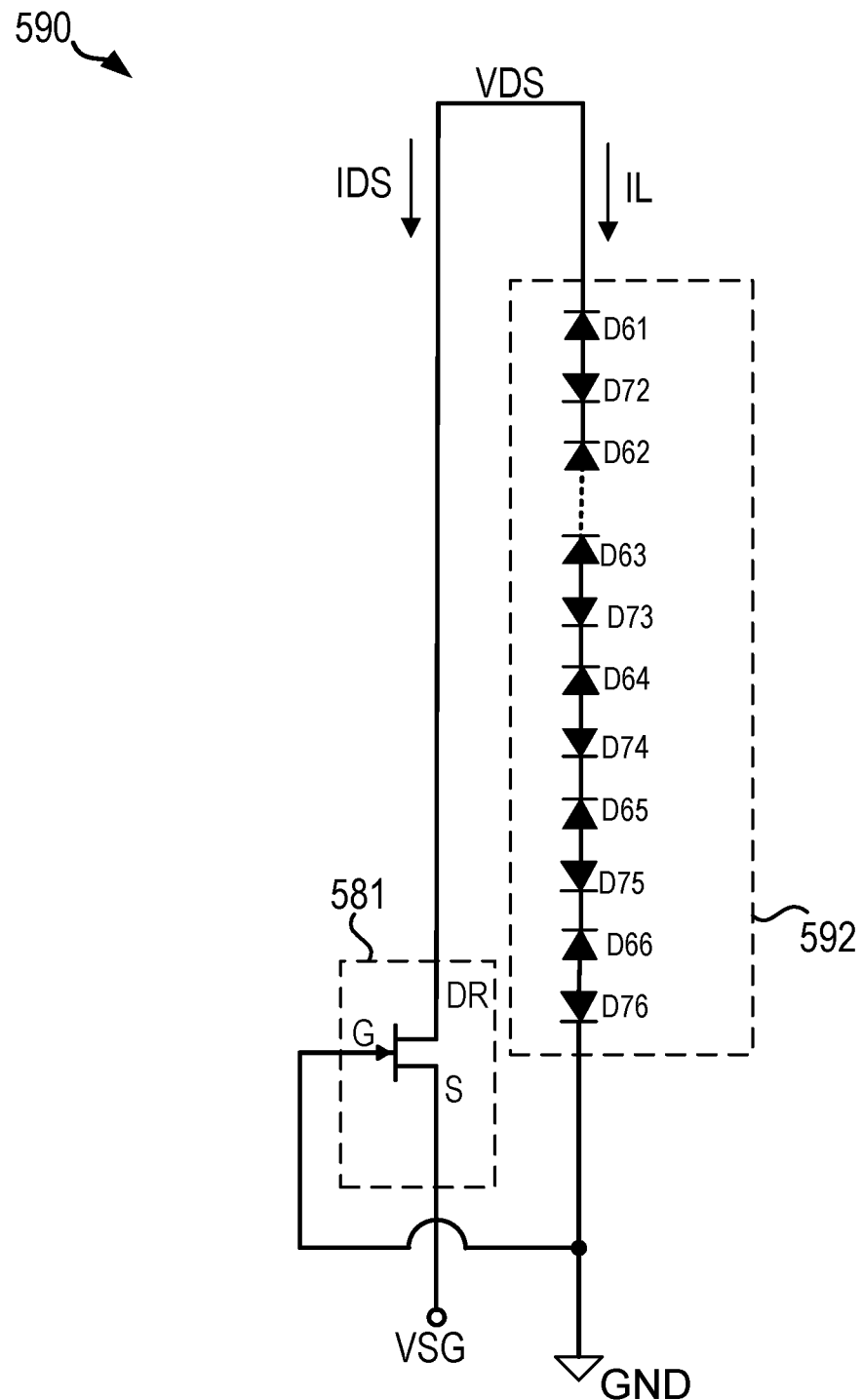
FIG. 5D illustrates a schematic corresponding to another embodiment of a device.

FIG. 5D illustrates a schematic 590 corresponding to another embodiment of a device. The device may also be a power device as depicted by cross section 500 of FIG. 5A and/or cross section 550 of FIG. 5B, except diode array 592 replaces diode array 582. Unlike diode array 582, diode array 592 includes series coupled diodes D61-D66 and diodes D72-D76 oriented in opposite directions. For instance, diode D61 and diode D72 are electrically coupled in a back-to-back arrangement. Also as illustrated, a cathode of diode D61 is electrically coupled to the drain DR of JFET 581 and a cathode of diode D76 is electrically coupled to the gate G of JFET 581. Accordingly, when the drain-to-source voltage VDS is greater than zero, then diodes D61-D66 may operate in reverse bias to limit a leakage current IL. Additionally, when the drain-to-source voltage VDS is less than zero then diodes D72-D76 may also operate in reverse bias.

Figure 6A:
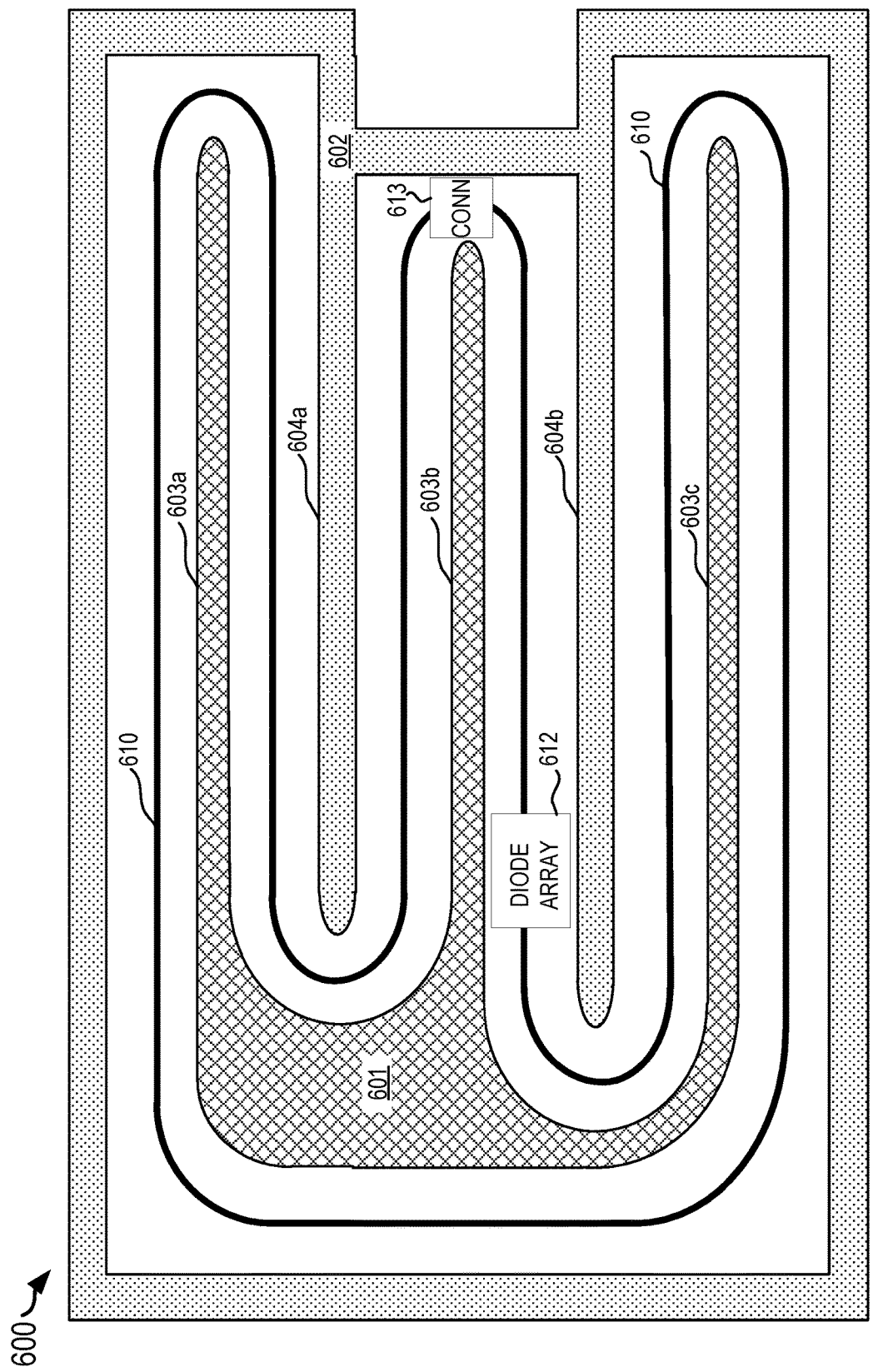
FIG. 6A illustrates a simplified layout for routing a guard ring path between device regions according to an embodiment.

FIG. 6A illustrates a simplified layout 600 for routing a guard ring path 610 with device regions 601, 602 according to an embodiment. The device regions 601, 602 may correspond with any of the preceding device regions; for instance device region 601 may correspond with device region 401 and/or device region 501, and device region 602 may correspond with device region 402 and/or device region 502. By way of example with reference to FIG. 4A and/or FIG. 4B, device region 601 may correspond with a drain (DR) having drain fingers 603a-c (i.e., extensions); and device region 602 may correspond with a source/body (S/B) region with source/body S/B fingers 604a-b. Additionally, the guard ring path 610 is illustrated by a single path line with curvilinear segments for clarity and to show where a diode array 612 and a connection region 613 may be located in the simplified layout 600.

According to the teachings herein, the diode array 612 can be located in any portion of the guard ring path 610, and for ease of illustration the diode array 612 is shown as being formed along a straight portion of the guard ring path 610. Also, according to the teachings herein, a connection region 613 may be located in any portion of the guard ring path 610; for instance, as illustrated the connection region 613 may be formed in a curvilinear portion of the guard ring path 610.

Figure 6B:
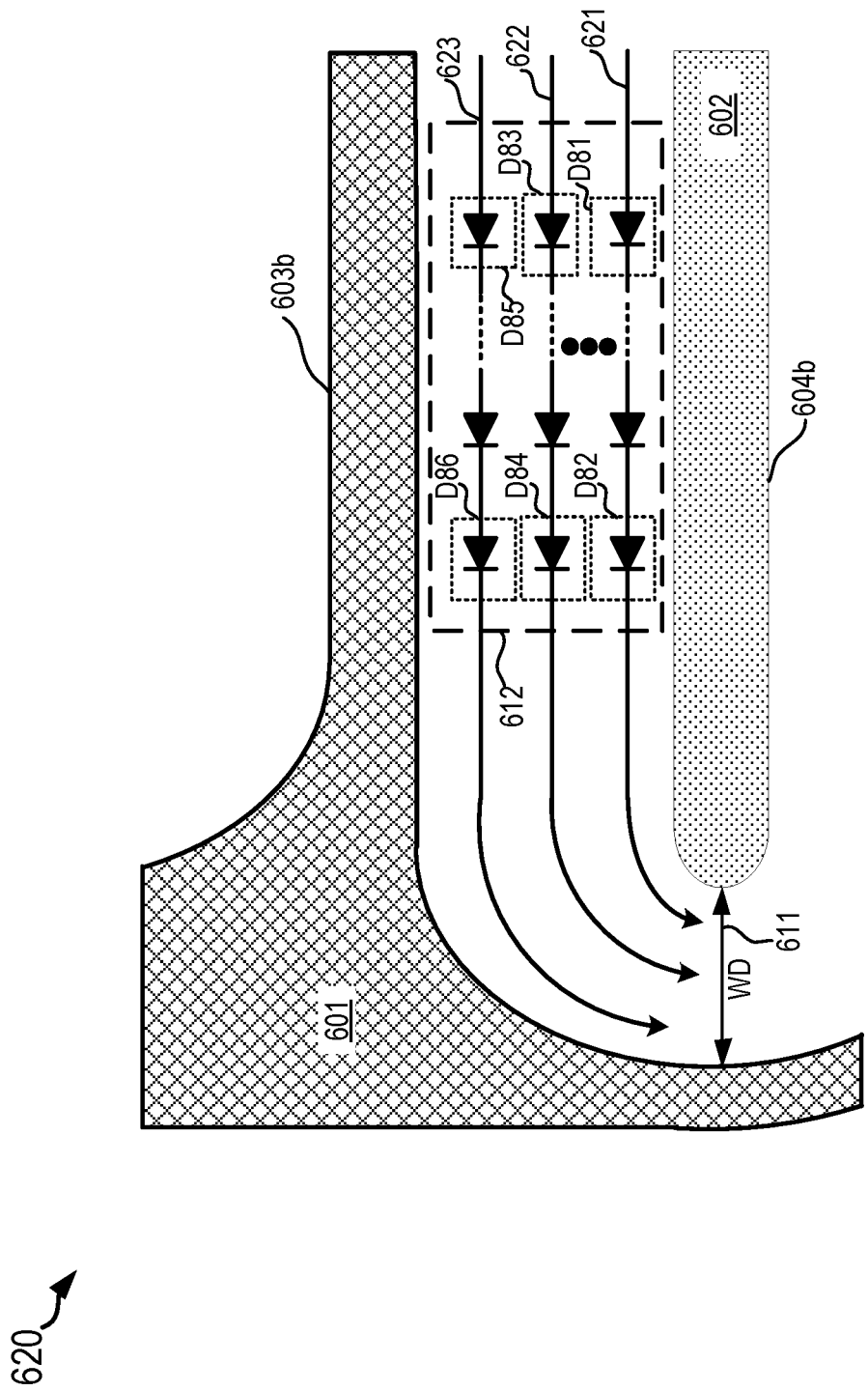
FIG. 6B illustrates a simplified layout magnification of a diode array according to an embodiment.

FIG. 6B illustrates a simplified layout magnification 620 of a diode array 612 according to an embodiment. The simplified layout magnification 620 may correspond with a magnification of the guard ring path 610 between drain finger 603b and source finger 604b shown in simplified layout 600. However, in the simplified layout magnification 620 the guard ring path 610 of the simplified layout 600 is replaced by guard rings 621-623 schematically represented by counter-clockwise directed lines and curvilinear segments. The guard rings 621-623 may be formed with polysilicon deposited and patterned at the surface of a drift region defined between device region 601 and device region 602. For instance, the guard rings 621-623 are shown by a drift-region-length marker 611 as following a counter-clockwise direction above a drift region of dimension WD (i.e., drift-region length).

According to the teachings herein, diodes may be formed within guard rings 621-623 using standard process techniques (e.g., implanted and diffused regions as described in figures FIG. 2A-FIG. 2H). For instance, guard ring 621 includes a plurality of diodes comprising diodes D81-D82. Also, guard ring 622 includes a plurality of diodes comprising diodes D83-D84; and guard ring 623 includes a plurality of diodes comprising diodes D85-D86.

Although the simplified layout magnification 620 shows an embodiment with three guard rings 621-623, the number of guard rings can be greater or fewer depending on the value of dimension WD (i.e., drift-region length). According to the teachings herein, the number of guard rings can be selected to meet a process critical dimension and/or OD layer requirement. For instance, when implemented in a sub-micron (e.g., a 0.35 micron) CMOS process, the dimension WD can be sixty microns for meeting a breakdown voltage (e.g., seven-hundred and twenty-five volts); and the number of guard rings 621-623 can be between fifty and seventy.

Figure 6C:
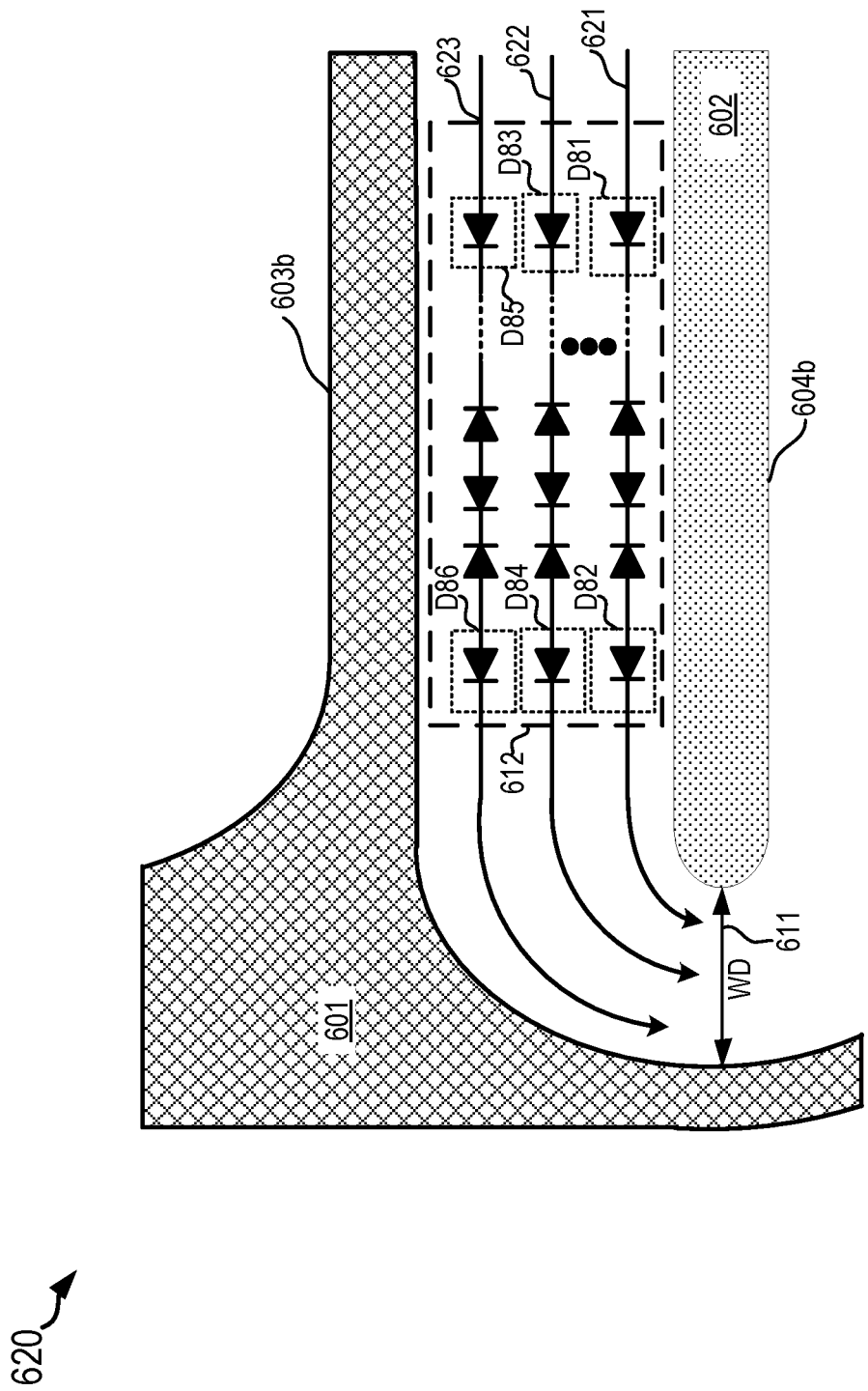
FIG. 6C illustrates a simplified layout magnification of a diode array according to another embodiment.

FIG. 6C illustrates a simplified layout magnification 620 of a diode array 612 according to another embodiment. The embodiment of FIG. 6C is similar to that of FIG. 6B except the diode array 612 includes additional diodes for a back-to-back diode arrangement.

Figure 6D:
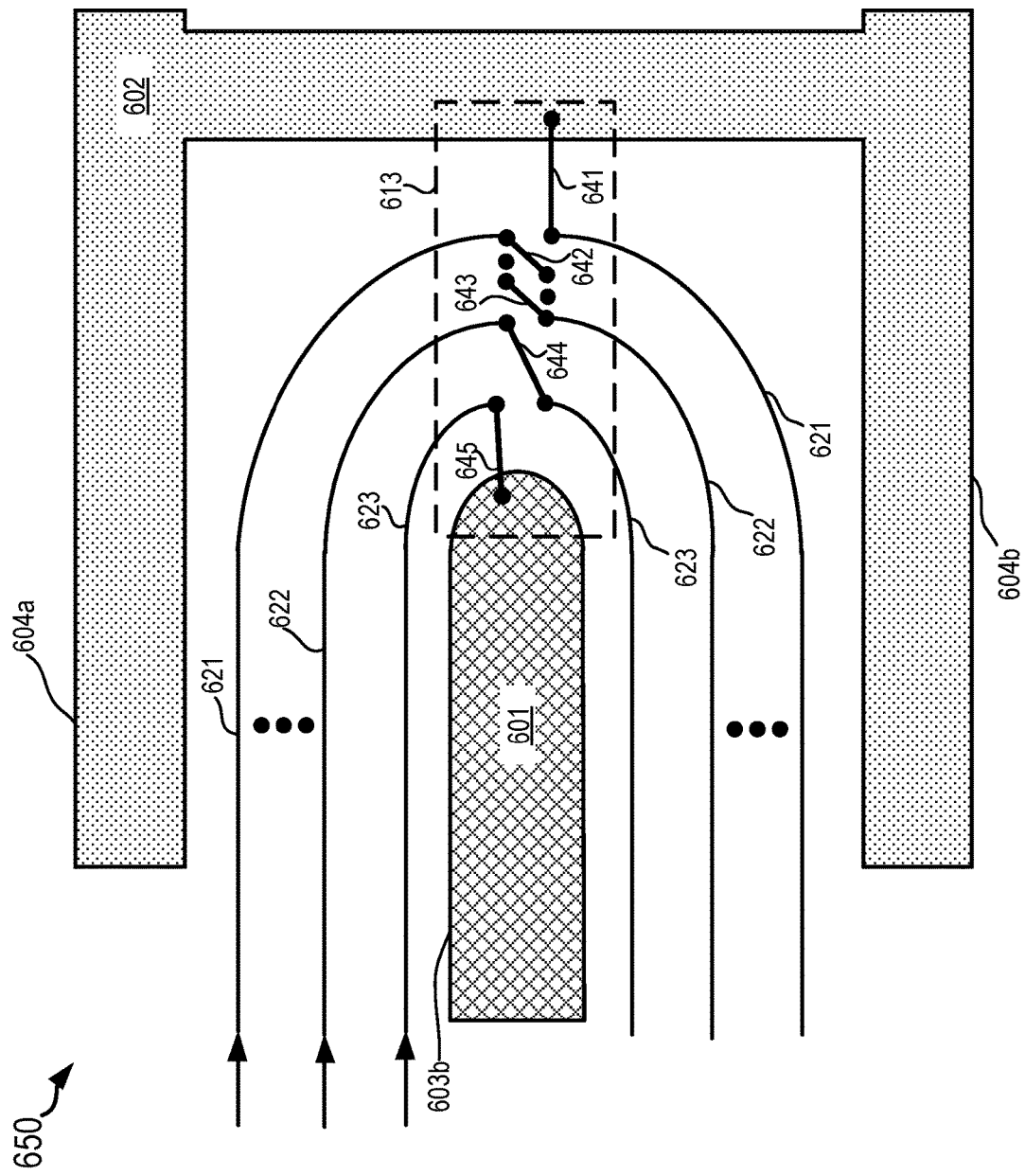
FIG. 6D illustrates a simplified layout magnification of the connection region according an embodiment.

FIG. 6D illustrates a simplified layout magnification 650 of the connection region 613 according an embodiment. The simplified layout magnification 650 may correspond with a magnification of the guard ring path 610 around a curvilinear portion of drain finger 603b. However, in the simplified layout magnification 650 the guard ring path 610 of the simplified layout 600 is again replaced by guard rings 621-623 schematically represented by clockwise directed lines and curvilinear segments.

According to the teachings herein, the connection region 613 may provide electrical connections so that the diodes (e.g., diodes D81-D86) are series connected (see, e.g., series connected diode arrays 472, 473, 582, and/or 592). For instance, the connection region 613 schematically illustrates interconnect segments 641-645 as coupling guard rings 621-623 in series. For instance, with reference to the diode array 612, interconnect segment 641 may electrically couple device region 602 to guard ring 621 so that the anode of diode D81 electrically couples to device region 602 (e.g. a source/body S/B). Similarly, interconnect segment 644 may electrically couple guard ring 622 to guard ring 623 so that a cathode of diode D84 is series connected (i.e., electrically coupled) with an anode of diode D85; and interconnect segment 645 may electrically couple guard ring 623 to device region 601 so that the cathode of diode D86 is electrically coupled to device region 601 (e.g., a drain DR). Also as illustrated, the cathode of diode D82 may follow through to interconnect segment 642 which may electrically couple to a subsequent guard ring; and as illustrated, there can be greater or fewer than four interconnect segments in order to series connect the plurality of guard rings 621-623.

Figure 7:
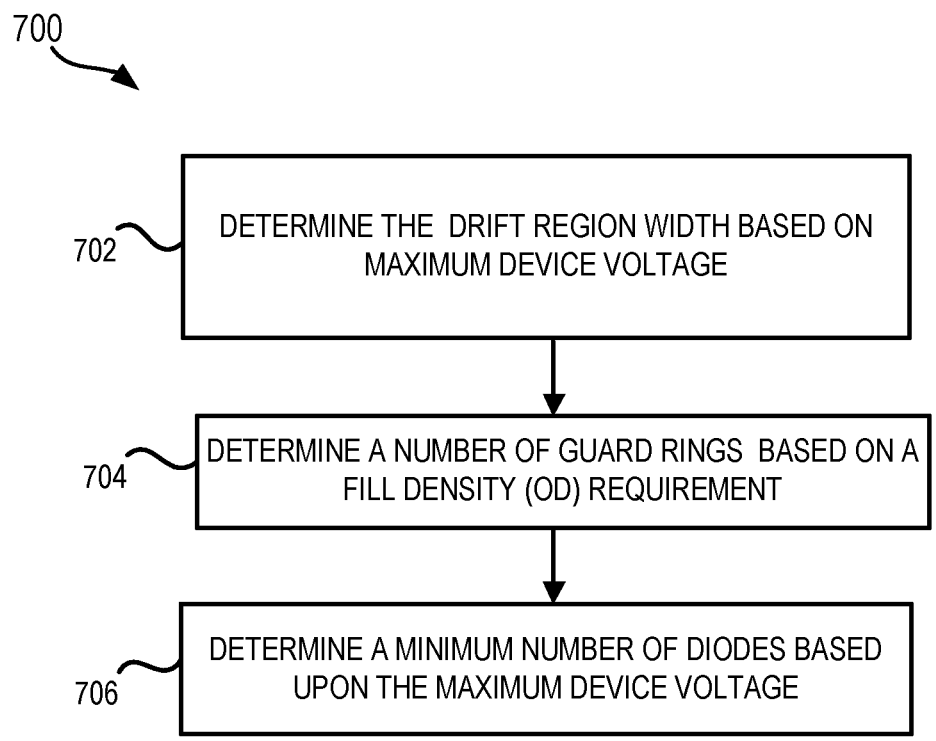
FIG. 7 illustrates a method for placing guard rings with diodes according to an embodiment.

FIG. 7 illustrates a method 700 for placing guard rings with diodes according to an embodiment. Step 702 may correspond with determining a drift diffusion dimension WD (e.g., dimension WD of simplified layout magnification 620) for meeting a maximum device voltage (i.e., a breakdown voltage). Step 704 may correspond with determining the number of guard rings (e.g., number of guard rings 621-623) to meet an OD density requirement. For instance, in a sub-micron (e.g., 0.35 micron) process a dimension WD may be sixty to seventy microns to meet a breakdown voltage requirement of approximately seven-hundred fifty volts; and in order to meet an OD density requirement, the number of guard rings (e.g., polysilicon guard rings) may be between fifty and seventy. The next step 706 may correspond with determining the number of diodes based on the maximum voltage. According to the teachings herein, the number of diodes (e.g., number of series connected diodes D41-D50, diodes D51-51, diodes D81-D86), can be selected so that the leakage current (e.g., leakage current IL) of the diodes is substantially less than an off-state drain-to-source current IDS (see, e.g., any of figures FIG. 4C, FIG. 4D, FIG. 5C, FIG. 5D).

Figure 8:
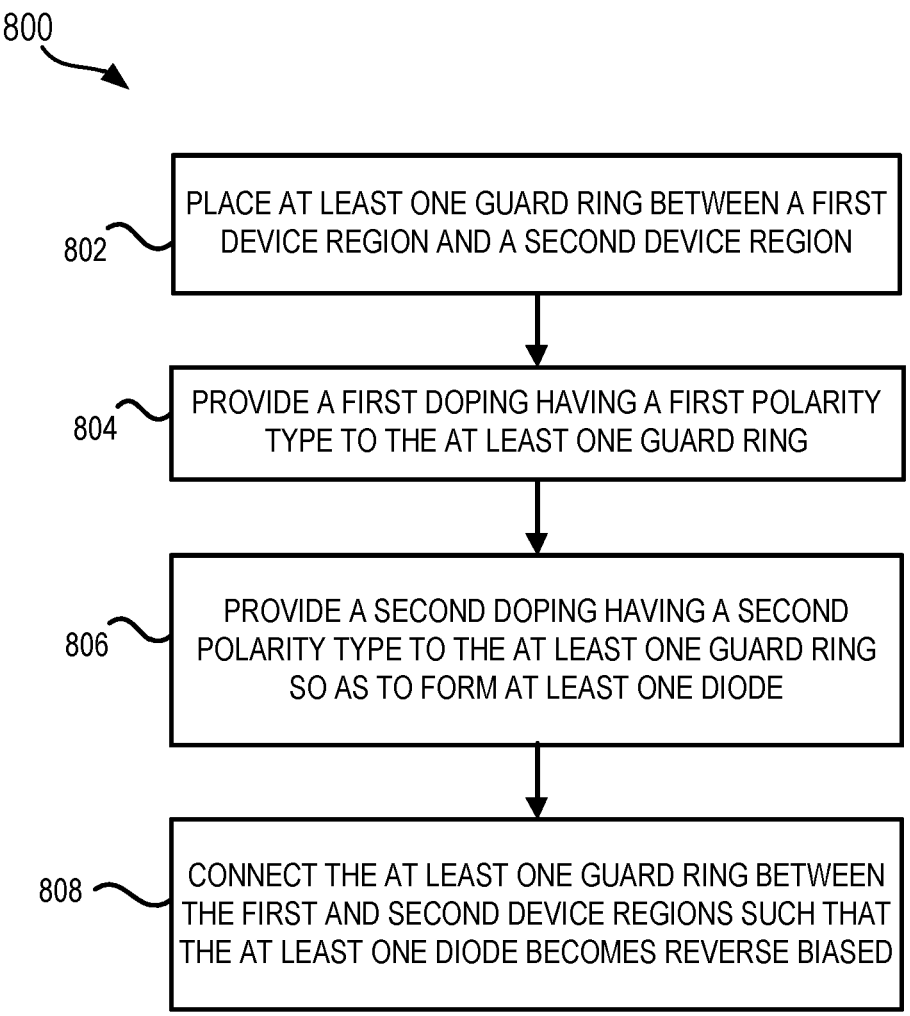
FIG. 8 illustrates a method for placing guard rings with diffused diodes according to an embodiment.

FIG. 8 illustrates a method 800 for placing guard rings with diffused diodes according to an embodiment. Step 802 may correspond with placing a guard ring (e.g., a guard ring 112) between a first device region (e.g., device region 101) and a second device region (e.g., device region 102). Step 804 may correspond with providing a first doping having a first polarity type (e.g., N-region 105f). Step 806 may correspond with providing a second doping having a second polarity type (e.g., P-region 106f) to form a diode (e.g., the PN-junction formed by P-region 106f with N-region 105f). Step 808 may correspond with connecting the guard ring (e.g., guard ring 112) so that the at least one diode operates in reverse bias. As described above the at least one diode may have a leakage current IL which is less than an off-state drain-to-source current IDS.

As presented herein, one aspect of the teachings is a semiconductor device (e.g., a power device, LDMOS, and/or JFET as described herein). The semiconductor device comprises a first device region (e.g., a device region 101, 301, 401, 501, and/or 601) and a second device region (e.g., a device region 102, 302, 402, 502, and/or 602). The semiconductor device also comprises a drift region (e.g., N-drift region 150, 430, and/or 530) between the first device region and the second device region and at least one guard ring (e.g., guard ring 110, 112, 410-412, 440-442, 510-512, 570-572, and/or 621-623). The at least one guard ring comprises at least one diode (e.g., diode D1-D15, D20, D22, D25-D27 and/or D28). The at least one diode is electrically coupled between the first device region and the second device region. The semiconductor device may receive a voltage (e.g., a drain-to-source voltage VDS) between the first device region and the second device region. The at least one diode is configured to provide (i.e., to operate with) a leakage current (e.g., leakage current IL) in response to the voltage; and the at least one guard ring is configured to support an electric field within the drift region in response to the voltage. According to the teachings herein low leakage current may advantageously enhance the electric field spreading without deleteriously affecting existing (i.e., normal) semiconductor device performance; and enhanced electric field spreading may in turn reduce breakdown-voltage drift.

In another aspect a power semiconductor device comprises a first device region, a second device region, and a plurality of guard rings. The first device region (e.g., device region 101) and the second device region (e.g., device region 102) are separated by a drift region (e.g., N-drift region 150). The plurality of guard rings (e.g., guard rings 110, 112) are disposed above the drift region and electrically coupled in series between the first device region and the second device region. For instance, drawing FIG. 1C shows series coupling of guard rings 110, 112 using interconnect segments 107a-c. At least one of the guard rings (e.g., guard ring 110) comprises a plurality of diodes (e.g., diodes D1-D4 of drawing FIG. 1F). The plurality of guard rings are configured to spread an electric field in the drift region. The electric field may be spread at or near the surface of the drift region so as to mitigate the deleterious effects of mobile and/or fixed charges at the surface of the drift region.

As shown in drawings FIG. 1F and FIG. 1G, the plurality of guard rings may enclose (i.e., encircle) the first device region; and the second device region may enclose (i.e., encircle) the plurality of guard rings.

As shown in drawings FIG. 4C, FIG. 4D, FIG. 5C, and FIG. 5D, the plurality of diodes may form a series diode array (e.g., diode array 472, 473, 582, 592). The plurality of diodes may comprise at least one PIN diode (e.g., diode D20 of drawing FIG. 2A). The series diode array may be configured to provide a leakage current (e.g., leakage current IL).

The above description of illustrated examples of the present disclosure, including what is described in the Abstract, are not intended to be exhaustive or to be limitation to the precise forms disclosed. While specific embodiments of, and fabrication steps of coupled polysilicon guard rings for enhancing breakdown voltage in a power semiconductor device are described herein for illustrative purposes, various equivalent modifications are possible without departing from the broader spirit and scope of the present disclosure. Indeed, it is appreciated that the specific example process recipes and device cross sections are provided for explanation purposes and other process recipes with greater or fewer steps may also be employed in other embodiments and examples in accordance with the teachings herein.

Examples

Although the teachings herein are defined in the attached claims, it should be understood that the present disclosure may also be defined in accordance with the following examples:

1. A semiconductor device comprising:
a first device region;
a second device region;
a drift region between the first device region and the second device regions; and
at least one guard ring comprising at least one diode electrically coupled between the first device region and the second device region;
wherein the semiconductor device is configured to receive a voltage between the first device region and the second device region,
wherein the at least one diode is configured to provide a leakage current in response to the voltage, and
wherein the at least one guard ring is configured to support an electric field within the drift region in response to the voltage.

2. The semiconductor device of example 1, wherein the semiconductor device comprises a lateral diffused metal oxide field effect transistor (LDMOS).

3. The semiconductor device according to any of the preceding examples, wherein the semiconductor device comprises a junction field effect transistor (JFET).

4. The semiconductor device according to any of the preceding examples, wherein the at least one guard ring comprises polysilicon.

5. The semiconductor device according to any of the preceding examples, wherein the at least one diode comprises a plurality of diodes electrically coupled in series.

6. The semiconductor device according to any of the preceding examples, wherein the at least one diode is a p-type, intrinsic, n-type (PIN) diode.

7. The semiconductor device according to any of the preceding examples, wherein the at least one guard ring is disposed on a field oxide.

8. The semiconductor device according to any of the preceding examples, wherein the at least one diode comprises:

a first diode configured to operate with reverse bias in response to the voltage; and
a second diode.

9. The semiconductor device according to any of the preceding examples, wherein the second diode is configured to operate with reverse bias in response to the voltage.

10. The semiconductor device according to any of the preceding examples, wherein the second diode is configured to operate with forward bias in response to the voltage.

11. The semiconductor device according to any of the preceding examples, wherein the first device region is a drain region having a first polarity type.

12. The semiconductor device according to any of the preceding examples, wherein the first polarity type is n-type.

13. The semiconductor device according to any of the preceding examples, wherein the second device region is a body region having a second polarity type opposite to the first polarity type.

14. The semiconductor device according to any of the preceding examples, wherein the second polarity type is p-type.

15. The semiconductor device according to any of the preceding examples, wherein the at least one guard ring comprises a first guard ring.

16. The semiconductor device according to any of the preceding examples,
wherein the drift region comprises a first shallow trench isolation (STI) trench; and
wherein the first guard ring is disposed on an oxide of the first STI trench.

17. The semiconductor device according to any of the preceding examples,
wherein the at least one guard ring comprises a second guard ring;
wherein the drift region comprises a second STI trench; and
wherein the second guard ring is disposed on an oxide of the second STI trench.

18. The semiconductor according to any of the preceding examples, wherein the second STI trench is separated from the first STI trench by an oxide density (OD) layer critical dimension.

19. A power semiconductor device comprising:
a first device region and a second device region separated by a drift region; and
a plurality of guard rings disposed above the drift region and electrically coupled in series between the first device region and the second device region,
wherein at least one of the plurality of guard rings comprises a plurality of diodes, and
wherein the plurality of guard rings are configured to spread an electric field in the drift region.

20. The power semiconductor device of example 19, wherein the plurality of guard rings enclose the first device region and the second device region encloses the plurality of guard rings.

21. The power semiconductor device according to any of the preceding examples, wherein the voltage is greater than three hundred volts.

22. The power semiconductor device according to any of the preceding examples, wherein the first device region is n-type, the second device region is p-type, and the drift region is n-type.

23. The power semiconductor device according to any of the preceding examples, wherein the power semiconductor device is a lateral diffused metal oxide field effect transistor (LDMOS).

24. The power semiconductor device according to any of the preceding examples, wherein the power semiconductor device is a junction field effect transistor (JFET).

25. The power semiconductor device according to any of the preceding examples, wherein the plurality of diodes form a series diode array between the first device region and the second device region.

26. The power semiconductor device according to any of the preceding examples, where the plurality of diodes comprise at least one p-type, intrinsic, n-type (PIN) diode.

27. The power semiconductor device according to any of the preceding examples, wherein the series diode array is configured to provide the leakage current.

28. The power semiconductor device according to any of the preceding examples, wherein the series diode array is configured to be reverse biased by the voltage.

29. The power semiconductor device according to any of the preceding examples, wherein the series diode array comprises:
a first diode configured to be reverse biased by the voltage.

30. The power semiconductor device according to any of the preceding examples, wherein the series diode array comprises:
a second diode configured to be forward biased by the voltage.

31. The power semiconductor device according to any of the preceding examples, wherein the plurality of guard rings comprise:
at least one straight segment; and
at least one curvilinear segment.

32. The power semiconductor device according to any of the preceding examples, wherein the plurality of diodes comprise at least one diode diffused within the at least one straight segment.

33. The power semiconductor device according to any of the preceding examples, wherein the plurality of diodes comprise at least one diode diffused within the at least one curvilinear segment.

What is claimed is:

1. A semiconductor device comprising:
a first device region;
a second device region;
a drift region between the first device region and the second device regions; and
at least one guard ring comprising a first guard ring and further comprising at least one diode electrically coupled between the first device region and the second device region;
wherein the drift region comprises a first shallow trench isolation (STI) trench aligned with the first guard ring,
wherein the semiconductor device is configured to receive a voltage between the first device region and the second device region,
wherein the at least one diode is configured to provide a leakage current in response to the voltage, and
wherein the at least one guard ring is configured to support an electric field within the drift region in response to the voltage.

2. The semiconductor device of claim 1, wherein the semiconductor device comprises a lateral diffused metal oxide field effect transistor (LDMOS).

3. The semiconductor device of claim 1, wherein the semiconductor device comprises a junction field effect transistor (JFET).

4. The semiconductor device of claim 1, wherein the at least one guard ring comprises polysilicon.

5. The semiconductor device of claim 1, wherein the at least one diode comprises a plurality of diodes electrically coupled in series.

6. The semiconductor device of claim 1, wherein the at least one diode is a p-type, intrinsic, n-type (PIN) diode.

7. The semiconductor device of claim 1, wherein the at least one guard ring is disposed on a field oxide.

8. The semiconductor device of claim 1, wherein the at least one diode comprises:
a first diode configured to operate with reverse bias in response to the voltage; and
a second diode.

9. The semiconductor device of claim 8, wherein the second diode is configured to operate with reverse bias in response to the voltage.

10. The semiconductor device of claim 8, wherein the second diode is configured to operate with forward bias in response to the voltage.

11. The semiconductor device of claim 1, wherein the first device region is a drain region having a first polarity type.

12. The semiconductor device of claim 11, wherein the first polarity type is n-type.

13. The semiconductor device of claim 11, wherein the second device region is a body region having a second polarity type opposite to the first polarity type.

14. The semiconductor device of claim 13, wherein the second polarity type is p-type.

15. The semiconductor device of claim 1,
wherein the first guard ring is disposed on an oxide of the first STI trench.

16. The semiconductor device of claim 15,
wherein the at least one guard ring comprises a second guard ring;
wherein the drift region comprises a second STI trench; and
wherein the second guard ring is disposed on an oxide of the second STI trench.

17. The semiconductor device of claim 16, wherein the second STI trench is separated from the first STI trench by an oxide density (OD) layer critical dimension.

18. A power semiconductor device comprising:
a first device region and a second device region separated by a drift region; and
a plurality of guard rings disposed above the drift region and electrically coupled in series between the first device region and the second device region,
wherein the drift region comprises a shallow trench isolation (STI) trench aligned with at least one of the plurality of guard rings,
wherein the at least one of the plurality of guard rings comprises a plurality of diodes, and
wherein the plurality of guard rings are configured to spread an electric field in the drift region.

19. The power semiconductor device of claim 18, wherein the plurality of guard rings enclose the first device region and the second device region encloses the plurality of guard rings.

20. The power semiconductor device of claim 18, wherein a voltage between the first device region and the second device region is greater than three hundred volts.

21. The power semiconductor device of claim 18, wherein the first device region is n-type, the second device region is p-type, and the drift region is n-type.

22. The power semiconductor device of claim 18, wherein the power semiconductor device is a lateral diffused metal oxide field effect transistor (LDMOS).

23. The power semiconductor device of claim 18, wherein the power semiconductor device is a junction field effect transistor (JFET).

24. The power semiconductor device of claim 18, wherein the plurality of diodes form a series diode array between the first device region and the second device region.

25. The power semiconductor device of claim 24, where the plurality of diodes comprise at least one p-type, intrinsic, n-type (PIN) diode.

26. The power semiconductor device of claim 24, wherein the series diode array is configured to provide a leakage current.

27. The power semiconductor device of claim 24, wherein the series diode array is configured to be reverse biased by a voltage.

28. The power semiconductor device of claim 24, wherein the series diode array comprises:
   a first diode configured to be reverse biased by a voltage.

29. The power semiconductor device of claim 28, wherein the series diode array comprises:
   a second diode configured to be forward biased by the voltage.

30. The power semiconductor device of claim 24, wherein the plurality of guard rings comprise:
   at least one straight segment; and
   at least one curvilinear segment.

31. The power semiconductor device of claim 30, wherein the plurality of diodes comprise at least one diode diffused within the at least one straight segment.

32. The power semiconductor device of claim 30, wherein the plurality of diodes comprise at least one diode diffused within the at least one curvilinear segment.

* * * * *